United States Patent
Gennari et al.

(10) Patent No.: US 9,519,732 B1
(45) Date of Patent: Dec. 13, 2016

(54) METHODS, SYSTEMS, AND ARTICLES OF MANUFACTURE FOR IMPLEMENTING PATTERN-BASED DESIGN ENABLED MANUFACTURING OF ELECTRONIC CIRCUIT DESIGNS

(71) Applicant: Cadence Design Systems, Inc., San Jose, CA (US)

(72) Inventors: Frank E. Gennari, San Jose, CA (US); Matthew Moskewicz, San Mateo, CA (US); Ya-Chieh Lai, Mountain View, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/801,183

(22) Filed: Mar. 13, 2013

(51) Int. Cl.
 *G06F 17/50* (2006.01)

(52) U.S. Cl.
 CPC .................................... *G06F 17/50* (2013.01)

(58) Field of Classification Search
 CPC ........................ G06F 2217/12; G06F 17/136
 USPC ................................................ 716/100, 136
 See application file for complete search history.

(56) References Cited

U.S. PATENT DOCUMENTS

| | | | |
|---|---|---|---|
| 5,587,918 A | 12/1996 | Hamada et al. | |
| 5,717,781 A | 2/1998 | Ebel et al. | |
| 5,801,954 A | 9/1998 | Le et al. | |
| 5,815,685 A | 9/1998 | Kamon | |
| 5,893,095 A | 4/1999 | Jain et al. | |
| 6,016,361 A | 1/2000 | Hongu et al. | |
| 6,044,007 A | 3/2000 | Capodieci | |
| 6,052,516 A | 4/2000 | Tajima | |
| 6,057,249 A | 5/2000 | Chen | |
| 6,131,182 A | 10/2000 | Beakes et al. | |
| 6,171,731 B1 | 1/2001 | Medvedeva et al. | |
| 6,187,483 B1 | 2/2001 | Capodieci et al. | |
| 6,393,602 B1 | 5/2002 | Atchison et al. | |
| 6,397,373 B1 | 5/2002 | Tseng et al. | |
| 6,425,112 B1 | 7/2002 | Bula et al. | |
| 6,453,274 B2 | 9/2002 | Kamon | |

(Continued)

FOREIGN PATENT DOCUMENTS

| | | |
|---|---|---|
| EP | 0651337 A1 | 5/1995 |
| JP | 05028274 A | 2/1993 |

OTHER PUBLICATIONS

Genarri, Frank E. et al., "A Pattern Matching System for Linking TCAD and EDA." Proceedings of the 5th International Symposium on Quality electronic Design, pp. 165-170, 2004.

(Continued)

*Primary Examiner* — Thuan Do
(74) *Attorney, Agent, or Firm* — Vista IP Law Group, LLP

(57) ABSTRACT

Some embodiments correlate various manufacturing or design information or data with patterns used to represent electronic designs and provide pertinent pattern-based information to metrology, fabrication, or testing tools to enhance their performances of their intended functions. Some embodiments further utilize cross-design or cross-process analytics to perform various pattern-based analyses on electronic designs. Some embodiments perform squish analysis with a squish pattern library on an electronic design to represent the electronic design with squish patterns by performing pattern matching, pattern decomposition, and pattern classification process.

23 Claims, 23 Drawing Sheets

(56) References Cited

U.S. PATENT DOCUMENTS

| | | |
|---|---|---|
| 6,453,457 B1 | 9/2002 | Pierrat et al. |
| 6,492,066 B1 | 12/2002 | Capodieci et al. |
| 6,523,162 B1 | 2/2003 | Agrawal et al. |
| 6,611,946 B1 | 8/2003 | Richardson et al. |
| 6,670,080 B2 | 12/2003 | Sugita et al. |
| 6,701,022 B2 | 3/2004 | Hirao et al. |
| 6,804,394 B1 | 10/2004 | Hsu |
| 6,883,158 B1 | 4/2005 | Sandstrom et al. |
| 6,892,364 B2 | 5/2005 | Baader et al. |
| 6,902,855 B2 | 6/2005 | Peterson et al. |
| 6,952,688 B1 | 10/2005 | Goldman et al. |
| 6,973,635 B2 | 12/2005 | Happoya |
| 7,003,758 B2 | 2/2006 | Ye et al. |
| 7,030,997 B2 | 4/2006 | Neureuther et al. |
| 7,062,741 B1 | 6/2006 | Leng et al. |
| 7,079,223 B2 | 7/2006 | Rosenbluth et al. |
| 7,082,588 B2 | 7/2006 | Scheffer et al. |
| 7,124,386 B2 | 10/2006 | Smith et al. |
| 7,152,215 B2 | 12/2006 | Smith et al. |
| 7,155,698 B1 | 12/2006 | Gennari |
| 7,174,520 B2 | 2/2007 | White et al. |
| 7,174,521 B2 | 2/2007 | Stine et al. |
| 7,175,940 B2 | 2/2007 | Laidig et al. |
| 7,243,316 B2 | 7/2007 | White et al. |
| 7,254,798 B2 | 8/2007 | Scheffer et al. |
| 7,260,810 B2 | 8/2007 | Filippi et al. |
| 7,278,118 B2 | 10/2007 | Pileggi et al. |
| 7,289,867 B1 | 10/2007 | Markle et al. |
| 7,302,672 B2 | 11/2007 | Pack et al. |
| 7,305,645 B1 * | 12/2007 | Capodieci et al. ............ 716/129 |
| 7,318,214 B1 | 1/2008 | Prasad et al. |
| 7,325,206 B2 | 1/2008 | White et al. |
| 7,342,646 B2 | 3/2008 | Shi et al. |
| 7,353,475 B2 | 4/2008 | White et al. |
| 7,356,783 B2 | 4/2008 | Smith et al. |
| 7,360,179 B2 | 4/2008 | Smith et al. |
| 7,363,099 B2 | 4/2008 | Smith et al. |
| 7,363,598 B2 | 4/2008 | Smith et al. |
| 7,367,008 B2 | 4/2008 | White et al. |
| 7,373,627 B2 | 5/2008 | Shigyo et al. |
| 7,380,220 B2 | 5/2008 | Smith et al. |
| 7,383,521 B2 | 6/2008 | Smith et al. |
| 7,386,162 B1 | 6/2008 | Dakshina-Murthy et al. |
| 7,386,433 B2 | 6/2008 | MacLean et al. |
| 7,392,496 B1 | 6/2008 | Schultz et al. |
| 7,393,755 B2 | 7/2008 | Smith et al. |
| 7,395,516 B2 | 7/2008 | Fujimura et al. |
| 7,401,310 B1 | 7/2008 | Thaden et al. |
| 7,403,265 B2 | 7/2008 | Tinnemans et al. |
| 7,412,676 B2 | 8/2008 | Cobb et al. |
| 7,418,693 B1 | 8/2008 | Gennari et al. |
| 7,444,616 B2 | 10/2008 | Sandstrom et al. |
| 7,448,014 B2 | 11/2008 | Lavin et al. |
| 7,451,411 B2 | 11/2008 | Hau-Riege et al. |
| 7,512,927 B2 | 3/2009 | Gallatin et al. |
| 7,526,748 B2 | 4/2009 | Kotani et al. |
| 7,530,048 B2 | 5/2009 | Joshi |
| 7,539,970 B2 | 5/2009 | Jung et al. |
| 7,566,517 B1 | 7/2009 | Adel et al. |
| 7,570,796 B2 | 8/2009 | Zafar et al. |
| 7,627,837 B2 | 12/2009 | Zhang |
| 7,631,289 B1 | 12/2009 | Lei |
| 7,646,906 B2 | 1/2010 | Saidin et al. |
| 7,653,892 B1 | 1/2010 | Gennari et al. |
| 7,661,087 B1 | 2/2010 | Gennari et al. |
| 7,676,077 B2 | 3/2010 | Kulkarni et al. |
| 7,685,558 B2 * | 3/2010 | Lai et al. ..................... 716/51 |
| 7,689,966 B2 | 3/2010 | Verma et al. |
| 7,695,876 B2 | 4/2010 | Ye et al. |
| 7,698,665 B2 | 4/2010 | Abrams et al. |
| 7,707,542 B1 | 4/2010 | Gennari et al. |
| 7,721,237 B2 | 5/2010 | Scheffer et al. |
| 7,735,053 B2 | 6/2010 | Harazaki |
| 7,739,651 B2 | 6/2010 | Melvin et al. |
| 7,752,577 B1 | 7/2010 | Gennari et al. |
| 7,752,584 B2 | 7/2010 | Yang |
| 7,818,707 B1 | 10/2010 | Gennari et al. |
| 7,831,942 B1 | 11/2010 | Gennari et al. |
| 7,861,193 B2 | 12/2010 | Meserve |
| 7,904,853 B1 | 3/2011 | Lei et al. |
| 7,934,174 B2 | 4/2011 | Tang et al. |
| 7,966,586 B1 | 6/2011 | Lei et al. |
| 8,079,005 B2 | 12/2011 | Lai et al. |
| 8,086,981 B2 | 12/2011 | Lai et al. |
| 8,091,047 B1 | 1/2012 | Gennari et al. |
| 8,161,448 B1 | 4/2012 | Croix et al. |
| 8,209,141 B2 * | 6/2012 | Bassett et al. ................ 702/120 |
| 8,312,413 B2 | 11/2012 | Stellari et al. |
| 8,327,299 B1 | 12/2012 | Gennari et al. |
| 8,365,103 B1 | 1/2013 | Gennari et al. |
| 8,381,152 B2 | 2/2013 | Lai et al. |
| 8,429,582 B1 | 4/2013 | Lai et al. |
| 8,468,482 B1 * | 6/2013 | Pack et al. .................... 716/110 |
| 8,516,406 B1 | 8/2013 | Lai et al. |
| 8,543,965 B1 | 9/2013 | Lai et al. |
| 8,631,373 B1 | 1/2014 | Gennari et al. |
| 8,645,887 B2 | 2/2014 | Lai et al. |
| 8,677,301 B2 | 3/2014 | Lai et al. |
| 8,769,474 B1 | 7/2014 | Gennari et al. |
| 8,807,948 B2 | 8/2014 | Luo et al. |
| 8,832,621 B1 | 9/2014 | Gennari et al. |
| 2001/0008564 A1 | 7/2001 | Hirao et al. |
| 2002/0083401 A1 | 6/2002 | Breiner et al. |
| 2002/0188917 A1 | 12/2002 | Yokoyama et al. |
| 2003/0033041 A1 | 2/2003 | Richey |
| 2003/0044047 A1 | 3/2003 | Kelly et al. |
| 2003/0061592 A1 | 3/2003 | Agrawal et al. |
| 2003/0103189 A1 | 6/2003 | Neureuther et al. |
| 2003/0118917 A1 | 6/2003 | Zhang et al. |
| 2003/0159120 A1 | 8/2003 | Baader et al. |
| 2003/0192013 A1 | 10/2003 | Cote et al. |
| 2003/0229879 A1 | 12/2003 | Pierrat |
| 2003/0237064 A1 | 12/2003 | White et al. |
| 2004/0003357 A1 | 1/2004 | Palusinski et al. |
| 2004/0076323 A1 | 4/2004 | Fujii et al. |
| 2004/0086197 A1 | 5/2004 | Fletcher et al. |
| 2004/0123265 A1 | 6/2004 | Andreev et al. |
| 2004/0202355 A1 | 10/2004 | Hillhouse |
| 2004/0210423 A1 | 10/2004 | Ashida et al. |
| 2004/0216065 A1 | 10/2004 | Cobb et al. |
| 2004/0243962 A1 | 12/2004 | Subasic et al. |
| 2005/0015740 A1 | 1/2005 | Sawicki et al. |
| 2005/0037522 A1 | 2/2005 | Smith et al. |
| 2005/0044514 A1 | 2/2005 | Wu et al. |
| 2005/0051809 A1 | 3/2005 | Smith et al. |
| 2005/0060672 A1 | 3/2005 | Poechmueller |
| 2005/0076316 A1 | 4/2005 | Pierrata et al. |
| 2005/0076322 A1 | 4/2005 | Ye et al. |
| 2005/0091631 A1 | 4/2005 | Gallatin et al. |
| 2005/0100802 A1 | 5/2005 | Callan et al. |
| 2005/0114822 A1 | 5/2005 | Axelrad et al. |
| 2005/0130047 A1 | 6/2005 | Kroyan |
| 2005/0132306 A1 | 6/2005 | Smith et al. |
| 2005/0188338 A1 | 8/2005 | Kroyan et al. |
| 2005/0196964 A1 | 9/2005 | Smith et al. |
| 2005/0198602 A1 | 9/2005 | Brankner |
| 2005/0235246 A1 | 10/2005 | Smith et al. |
| 2005/0251771 A1 | 11/2005 | Robles |
| 2005/0263722 A1 | 12/2005 | Marrian et al. |
| 2005/0268256 A1 | 12/2005 | Tsai et al. |
| 2006/0026544 A1 | 2/2006 | Engel et al. |
| 2006/0075379 A1 | 4/2006 | Kamat |
| 2006/0085772 A1 | 4/2006 | Zhang |
| 2006/0190850 A1 | 8/2006 | Kohle et al. |
| 2006/0203233 A1 | 9/2006 | Yu |
| 2006/0206851 A1 | 9/2006 | Van Wingerden et al. |
| 2006/0228041 A1 | 10/2006 | Joshi |
| 2006/0265679 A1 | 11/2006 | Scheffer et al. |
| 2006/0277520 A1 | 12/2006 | Gennari et al. |
| 2006/0282814 A1 | 12/2006 | Percin et al. |
| 2007/0006114 A1 | 1/2007 | Scheffer et al. |
| 2007/0032896 A1 | 2/2007 | Ye et al. |
| 2007/0077504 A1 | 4/2007 | Park |
| 2007/0089078 A1 | 4/2007 | Engel et al. |

(56) References Cited

U.S. PATENT DOCUMENTS

| | | |
|---|---|---|
| 2007/0101301 A1 | 5/2007 | Miyata |
| 2007/0101305 A1 | 5/2007 | Smith et al. |
| 2007/0101310 A1 | 5/2007 | Stirniman et al. |
| 2007/0114396 A1 | 5/2007 | Tohyama |
| 2007/0119616 A1 | 5/2007 | Horikawa et al. |
| 2007/0179663 A1 | 8/2007 | McIntyre et al. |
| 2007/0234246 A1 | 10/2007 | Sinha et al. |
| 2007/0256039 A1 | 11/2007 | White |
| 2007/0266362 A1* | 11/2007 | Lai et al. ............ 716/19 |
| 2007/0266364 A1 | 11/2007 | Pack et al. |
| 2007/0283298 A1 | 12/2007 | Bernstein et al. |
| 2007/0288219 A1* | 12/2007 | Zafar et al. ............ 703/14 |
| 2008/0003510 A1 | 1/2008 | Harazaki |
| 2008/0027698 A1 | 1/2008 | White |
| 2008/0034335 A1 | 2/2008 | Cheng et al. |
| 2008/0127027 A1 | 5/2008 | Gallatin et al. |
| 2008/0148216 A1 | 6/2008 | Chan et al. |
| 2008/0160646 A1 | 7/2008 | White et al. |
| 2008/0162103 A1 | 7/2008 | White et al. |
| 2008/0163139 A1 | 7/2008 | Scheffer et al. |
| 2008/0163141 A1 | 7/2008 | Scheffer et al. |
| 2008/0163142 A1 | 7/2008 | White et al. |
| 2008/0163148 A1 | 7/2008 | Scheffer et al. |
| 2008/0163150 A1 | 7/2008 | White et al. |
| 2008/0189673 A1 | 8/2008 | Ying |
| 2008/0216027 A1 | 9/2008 | White et al. |
| 2008/0307371 A1 | 12/2008 | Fujimura et al. |
| 2009/0031261 A1 | 1/2009 | Smith et al. |
| 2009/0031271 A1 | 1/2009 | White et al. |
| 2009/0077524 A1* | 3/2009 | Nagamura ............ G03F 1/14 716/54 |
| 2009/0125868 A1 | 5/2009 | Mukherjee et al. |
| 2009/0199148 A1 | 8/2009 | Kyoh et al. |
| 2009/0271749 A1 | 10/2009 | Tang et al. |
| 2009/0288047 A1 | 11/2009 | Tang et al. |
| 2009/0297019 A1* | 12/2009 | Zafar et al. ............ 382/145 |
| 2009/0307642 A1 | 12/2009 | Lai et al. |
| 2010/0064269 A1 | 3/2010 | Lai et al. |
| 2010/0083208 A1 | 4/2010 | Lai et al. |
| 2010/0185999 A1 | 7/2010 | Graur et al. |
| 2010/0235136 A1* | 9/2010 | Bassett et al. ............ 702/120 |
| 2011/0219352 A1 | 9/2011 | Majumder et al. |
| 2012/0042290 A1 | 2/2012 | Berkens et al. |
| 2012/0079442 A1* | 3/2012 | Akar et al. ............ 716/112 |
| 2012/0272200 A1 | 10/2012 | Lai et al. |
| 2012/0272201 A1 | 10/2012 | Lai et al. |
| 2013/0086541 A1 | 4/2013 | Luo et al. |
| 2014/0033159 A1* | 1/2014 | Hui et al. ............ 716/132 |

OTHER PUBLICATIONS

Roseboom, E. et al., "Automated Full-Chip Hotspot Detection and Removal Flow for Interconnect Layers of Cell-Based Designs." SPIE 2007, 9 pages.

Ma, M. et al., "Automatic hotspot classification using pattern-based clustering," Proc. SPIE 6925, 692505, Feb. 28, 2008.

Non-Final Office Action dated Jul. 18, 2013 for U.S. Appl. No. 13/305,669.

Advisory Action dated Apr. 14, 2014 for U.S. Appl. No. 13/305,669.

Final Office Action dated Jan. 30, 2014 for U.S. Appl. No. 13/305,669.

Notice of Allowance dated May 12, 2014 for U.S. Appl. No. 13/305,669.

Final Office Action dated Feb. 4, 2014 for U.S. Appl. No. 13/802,738.

Non-Final Office Action dated Aug. 13, 2013 for U.S. Appl. No. 13/802,738.

Notice of Allowance dated Jul. 29, 2014 for U.S. Appl. No. 13/802,738.

Elmasri, Ramez. Fundamentals of database systems. Pearson Education India, 2008, pp. 631-642.

* cited by examiner

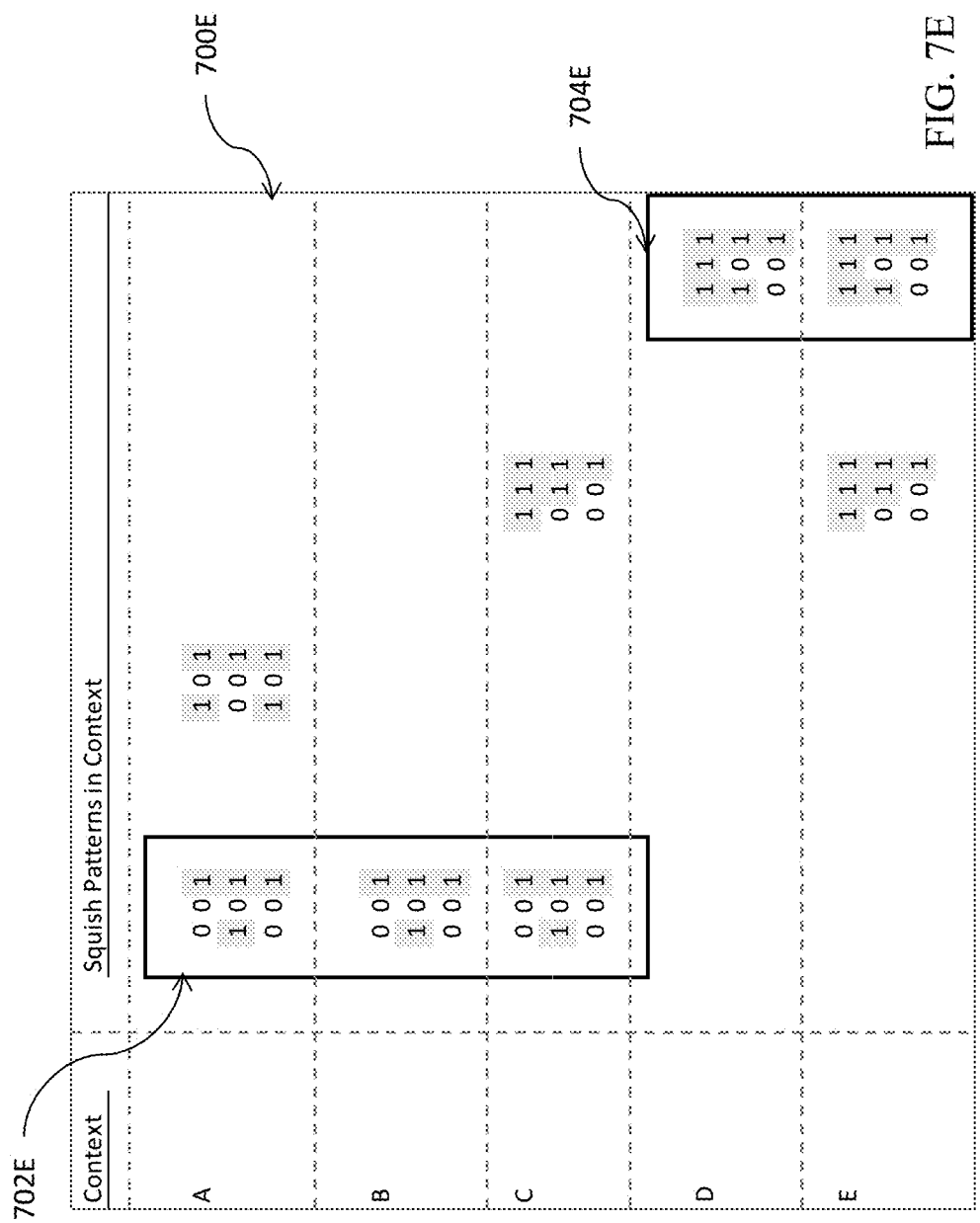

EXEMPLARY OUTPUT
rulename: rule_0_p100, sits covered: 100
tag: X3Y3L15e1, count: 938, src_ix: 1, loc: [4291 4995 4641 5145 ], symmetry: 32,
   rep_bits_orient: 2, rep_delta_orient: 5
rep: deltas[0]: 1, 50, 1 deltas[1]: 1, 150, 1
delta range: x_deltas="1 50-150 1" y_deltas="1 50-198 1"
all_deltas:
x0: 1:938
x1: 50:924 57:1 58:2 59:8 65:2 150:1
x2: 1:938
y0: 1:938
y1: 50:647 52:2 60:1 61:4 64:2 66:177 68:40 74:2 76:4 110:7 118:1 133:1 150:35 166:8 198:7
y2: 1:938

EXEMPLARY OUTPUT
tag: X1Y3L15, count: 72356, src_ix: 0, loc: [45705 16531 46105 16931 ], symmetry: 84,
rep_bits_orient: 0, rep_delta_orient: 0
rep: deltas[0]: 1 deltas[1]: 1, 390, 1
delta range: x_deltas="1" y_deltas="1 150-395 1"
all_deltas:
x0: 1:72356
y0: 1:72356
y1: 150:33823 155:746 160:621 165:199 170:1786 175:409 180:935 185:98 190:1588 195:298 200:1027 205:432 210:3167 215:439 220:462 225:690 230:1293 235:482 240:387 245:504 250:3866 255:347 260:635 265:400 270:1107 275:415 280:498 285:226 290:2117 295:39 300:326 305:225 310:1277 315:48 320:119 325:320 330:694 335:73 340:118 345:133 350:8512 355:153 360:58 365:167 370:404 375:94 380:75 385:45 390:448 395:31
y2: 1:72356

METHODS, SYSTEMS, AND ARTICLES OF MANUFACTURE FOR IMPLEMENTING PATTERN-BASED DESIGN ENABLED MANUFACTURING OF ELECTRONIC CIRCUIT DESIGNS

CROSS-REFERENCE TO RELATED APPLICATION(S)

This Application is related to U.S. patent application Ser. No. 13/305,669 filed on Nov. 28, 2011 entitled "TOPOLOGY DESIGN USING SQUISH PATTERNS", the content of which is hereby incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

As the complexity and number of process steps continue to increase in modern integrated circuit manufacturing, the number of yield limiters increases tremendously. For example, there may be tens of yield limiters for an electronic circuit at the 45-nm node but thousands of yield limiters for electronic designs at the 28-nm node. As a result, the need for systematic analysis, monitoring, or sharing of data or information about defects and violations between the electronic circuit design flow and the fabrication, inspection, or testing (hereinafter "manufacturing" collectively) of the electronic circuits also increases.

Moreover, any issues discovered during manufacturing may be very costly to fix because the photomasks or even some batches of the electronic circuits have already been manufactured. In addition, manufacturing tools (e.g., metrology equipment, electronic circuit testing equipment, or fabrication equipment, etc.) may require a long time to characterize their respective recipes and to perform their intended functions (e.g., inspection, measurement, testing, etc.) and most, if not all, manufacturing tools require some threshold levels of experiences and expertise of the operator in order to fulfill their intended functions.

For example, a metrology tool operator or a testing equipment operator may not know what areas may exhibit higher risks of becoming hotspots, what areas are more critical to the electronic circuit, what areas of a die constitute fill structures, etc. As a result, the random nature of some of these manufacturing processes in focusing their processes on some areas but not others may at best identify some issues associated with the electronic circuit design and requires proportionally longer periods of time to complete as the coverage requirement grows. For example, given hundreds or even more cassettes of wafers each containing tens, hundreds, or even more dies, an engineer operating a metrology tool can only sample a few of these processed wafers (e.g., one wafer for each cassette of wafers) and only a few sites on each wafer (e.g., 24 inspection sites along the periphery with 12 additional inspection sites distributed in the remaining area of a wafer). As a result, some non-functional or dysfunctional dies are further forwarded to testing and waste resources.

The limited resolution, fidelity, or accuracy of the manufacturing tools further exacerbates the difficulties in post-tape out manufacturing processes. For example, the accuracy of modern metrology tools in pinpointing the exact location of a defect may be off by multiple wiring tracks and as much +/−450 nm in some cases. Thus, an operator operating a metrology tool may not provide sufficiently accurate information about certain failures on wafers. Rather, such manufacturing tools with limited resolution, fidelity, or accuracy may only provide information or data with limited usefulness. Consequently, even if the electronic circuit design team may forward the critical areas or critical features in a form of a text file, a spread sheet, or the like to the manufacturing equipment operators such that the operators can be made aware of such critical areas or critical features, the limited resolution, fidelity, or accuracy of the information generated by such manufacturing tools still present very limited usefulness in communicating the information back to the electronic circuit design team.

Thus, there exists a need for a method, a system, and an article of manufacture for implementing high current carrying interconnects. There also exist a need for a method, a system, and an article of manufacture for implementing high current carrying interconnects using strand routing of various topologies while satisfying various physical or electrical constraints, rules, or requirements and generating an electronic design that produces satisfactory results for various electrical analyses.

SUMMARY

Disclosed are method(s), system(s), and article(s) of manufacture for implementing pattern-based design enabled manufacturing of electronic circuit designs in one or more embodiments.

In some embodiments, a computer system executing various modules described herein may execute the method to index a manufacturing analysis database with information about one or more patterns in some embodiments. In some of these embodiments, the computer system may execute the method to index a manufacturing analysis database by using a plurality of patterns as indices. The method may further identify DFM (design for manufacturing) data from one or more data structures. The manufacturing analysis database may include manufacturing analytics that may further include the DFM data or data or information derived from the DFM data. The method may further identify an electronic design that is to be manufactured, is being manufactured, or has already been manufactured and perform one or more analyses such as pattern analyses or squish analyses on the electronic design.

The method may also provide the results of pattern analysis to one or more manufacturing tools such as one or more metrology tools, one or more fabrication tools, one or more inspection tools, one or more electronic circuit testing tools, one or more failure or defect analysis tools, or a combination of at least some of the aforementioned tools. Providing the pattern analysis results to one or more manufacturing tools may eliminate any possible guesses or guesstimates of determining where the precise locations of one or more failures or violations may be located in the manufactured electronic circuit. Providing the pattern analysis results to one or more manufacturing tools may also eliminate failure to detect a failure or violation arising from the lack of knowledge in the DFM data concerning the manufactured electronic circuit.

In these embodiments, the method correlates DFM violations or failures, defects on the wafers, design topologies, fixes or solutions to violations or features with each other to provide pertinent information to one or more manufacturing tools to enhance the performance of the manufacturing tools. The method may further overlay pertinent information about a specific failure or violation at the precise location in the display of the one or more manufacturing tools to provide visual cues to the manufacturing tool users in some embodiments. The method may further track one or more patterns to develop and maintain the historical data about the one or more patterns across multiple wafers, across multiple designs, across multiple processes, or across multiple foundries in some embodiments. In addition or in the alternative, the method may perform one or more statistical analyses on the historical data about one or more patterns and use subsequently acquired data or information to train various processes, modules, models, or algorithms so as to improve the accuracy, effectiveness, or efficiencies of such various processes, modules, models, or algorithms.

In some other embodiments, a computing system may also execute various modules to invoke a method described herein to improve the electronic design flow. In some of these embodiments, the method may track and correlate various information or data with each other. For example, the method may correlate DFM failures or violations that may be captured and maintained as various patterns, defects on wafers, various design topologies, and solutions or fixes to violations or failures with each other such that the identification of one of such information or data automatically leads others. The method may also profile a design to identify a plurality of patterns, classify a family of patterns into single pattern such that the design may be completely represented a canonical set of unique patterns or a set of minimal number of unique patterns, and store the plurality of patterns or the canonical set of unique patterns in a manufacturing analysis database.

The method may further index the manufacturing analysis database with patterns to facilitate and enhance the performance of various pattern analyses or design profiling functionalities. The method may further identify critical dimensions of at least some of the patterns in the manufacturing analysis database and then track the corresponding critical dimensions of the matching patterns identified in an electronic design to keep at least the critical dimensions in the electronic design in check. Upon the identification of a pattern that may give rise to violations or failures, the method may also provide one or more fixes or repairs from the manufacturing analytics in the manufacturing analysis database without performing further analyses.

In some other embodiments, a computing system may also execute various modules such as those described with reference to FIGS. 1A-B to invoke a method described herein to implement pattern classification on an electronic design. In some embodiments, the method may identify an electronic design, a region for pattern extraction in the electronic design, and a pattern library. The method may further identify patterns in the region for extraction that match one or more existing patterns in the pattern library and form the remaining region by excluding the areas covered by these patterns in the region from analysis. The remaining region is thus the difference between the region for extraction and the areas covered by the patterns that match the one or more existing patterns in the pattern library. Depending upon the complexity of the remaining region, the method may either identify the remaining region as a new pattern (because no existing patterns may be used to represent the remaining region) or further decompose the remaining region into multiple, smaller contexts.

The method may then designate at least some of the multiple, smaller contexts as new patterns in some embodiments. In some other embodiments, the method may further perform pattern analysis on each of the multiple, smaller contexts to determine how each of the multiple, smaller contexts is represented by various pattern(s). If the method determines that at least some of the multiple, smaller contexts are represented by some common patterns, the method may then designate at least some of these common patterns as new patterns and persistently store them in the pattern library or the manufacturing analysis database. In some embodiments where the pattern library includes squish patterns, the method may further convert topological patterns into the corresponding squish patterns.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 7E illustrates an exemplary pattern classification result for a portion of an electronic circuit design in some embodiments.

DETAILED DESCRIPTION

Figure 1A:
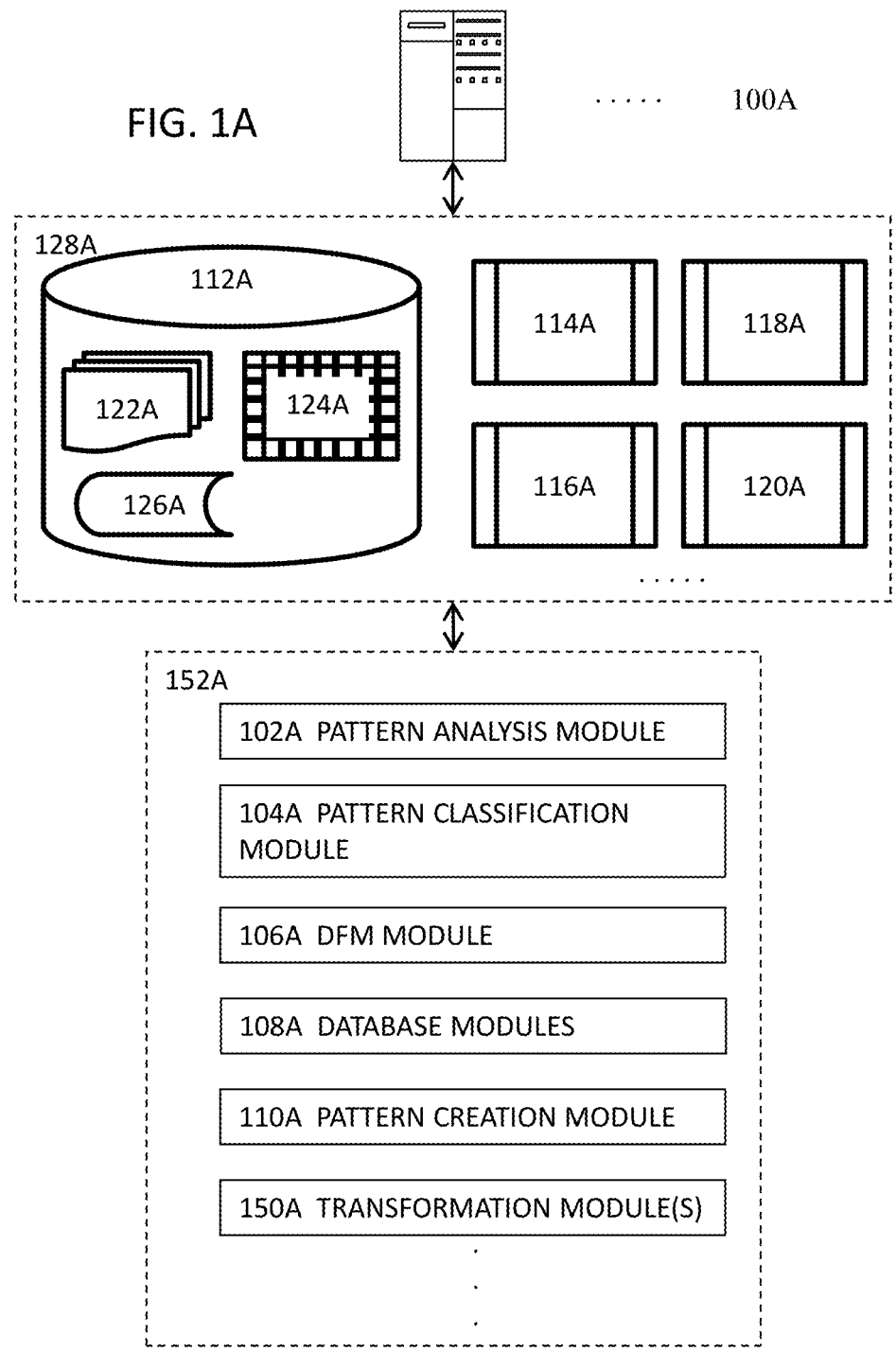
FIG. 1A illustrates a high level block diagram for a system for implementing pattern-based design enabled manufacturing of electronic circuit designs in some embodiments.

Various embodiments are directed to methods, systems, and articles of manufacture for implementing pattern-based design enabled manufacturing of electronic circuit designs. Some embodiments are directed to a methods, systems, and articles of manufacture for implementing pattern analysis or utilizing pattern analysis to implement electronic designs or to implement pattern-based design enabled manufacturing of electronic circuit designs. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are methods, systems, and articles of manufacture for implementing pattern-based design enabled manufacturing of electronic circuit designs in one or more embodiments. In a first aspect, a computer system executing various modules described herein may perform the method to index a manufacturing analysis database with information about one or more patterns in some embodiments. In some of these embodiments, the computer system may perform the method to index a manufacturing analysis database by using a plurality of patterns as indices. The method may further identify DFM (design for manufacturing) data from one or more data structures. In some embodiments, the manufacturing analysis database may include manufacturing analytics that may further include the DFM data or data or information derived from the DFM data.

The method may further identify at least a portion of an electronic design that is to be manufactured, is being manufactured, or has already been manufactured and then perform one or more pattern analyses on the electronic design. The method may then provide the results of pattern analysis to one or more manufacturing tools that may include, for example but not limited to, one or more metrology tools, one or more fabrication tools, one or more inspection tools, one or more electronic circuit testing tools, one or more failure analysis tools, or a combination of at least some of the aforementioned tools. The provisioning of the pattern analysis results to one or more manufacturing tools eliminate any possible guesses or guesstimates of determining the precise locations of one or more failures or violations in the manufactured electronic circuit. In these embodiments, the method correlates DFM violations or failures, defects on the wafers, design topologies, fixes or solutions to violations or features with each other to provide pertinent information to one or more manufacturing tools to enhance the performance of the manufacturing tools.

The method may also overlay pertinent information about a specific failure or violation at the precise location in the display of the one or more manufacturing tools to provide visual cues to the users of the manufacturing tools in some embodiments. The method may further track one or more patterns to develop and maintain the historical data about the one or more patterns across multiple wafers, across multiple designs, across multiple processes, or across multiple foundries in some embodiments. In addition or in the alternative, the method may perform one or more statistical analyses on the historical data about one or more patterns and use subsequently acquired data or information to train various processes, modules, models, or algorithms so as to improve the accuracy, effectiveness, or efficiencies of such various processes, modules, models, or algorithms.

Figure 1B:
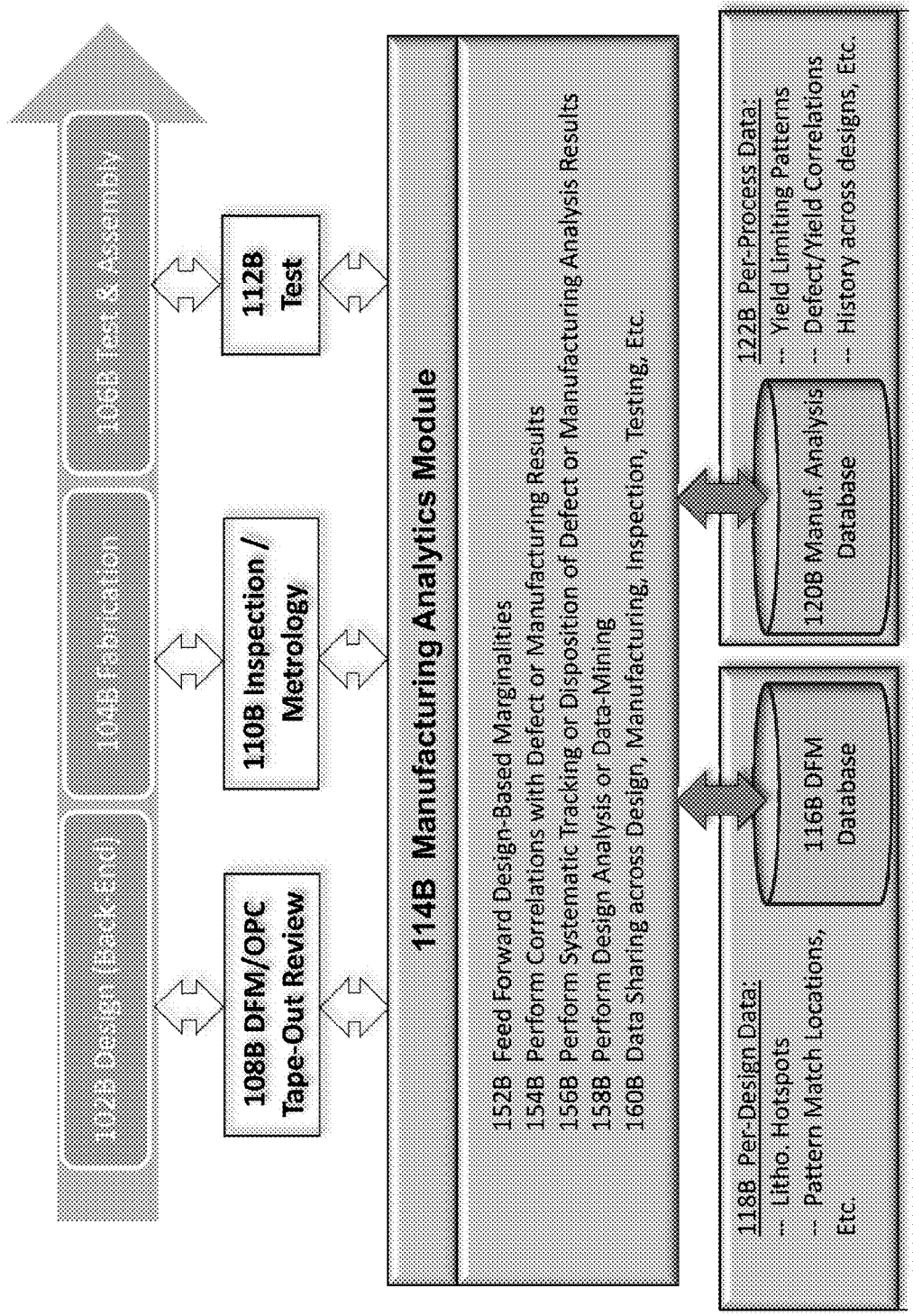
FIG. 1B illustrates a high level block diagram for a system for implementing pattern-based design enabled manufacturing of electronic circuit designs in some embodiments.

In another aspect, a computing system may also execute various modules such as those described with references to FIGS. 1A-B to invoke a method described herein to improve the electronic design flow. In some embodiments, the method may track and correlate various information or data with each other. For example, the method may correlate DFM failures or violations which may be captured and maintained as various patterns, defects on wafers, various design topologies, and solutions or fixes to violations or failures with each other such that the identification of one of such information or data automatically leads others. The method may also profile a design to identify a plurality of patterns, classify a family of patterns into single pattern such that the design may be completely represented by a canonical set of unique patterns or a set of a minimal number of unique patterns, and store the plurality of patterns or the canonical set of unique patterns in a manufacturing analysis database. The method may further index the manufacturing analysis database with patterns to facilitate and enhance the performance of various pattern analyses or design profiling functionalities. The method may further identify critical dimensions of at least some of the patterns in the manufacturing analysis database and then track the corresponding critical dimensions of the matching patterns identified in an electronic design to keep at least the critical dimensions in the electronic design in check. Upon the identification of a pattern that may give rise to violations or failures, the method may also provide one or more fixes or repairs without performing further analyses.

In yet another aspect, a computing system may also execute various modules to invoke a method described herein to implement pattern classification on an electronic design. In some embodiments, the method may identify an electronic design, a region for pattern extraction in the electronic design, and a pattern library. The method may then identify patterns in the region for extraction that match one or more existing patterns in the pattern library and exclude the areas covered by these patterns in the region from analysis. The remaining region is thus the difference between the region for extraction and the areas covered by the patterns that match the one or more existing patterns in the pattern library. Depending upon the complexity of the remaining region, the method may either identify the remaining region as a new pattern (because no existing patterns may be used to represent the remaining region) or further decompose the remaining region into multiple smaller contexts. The method may then designate at least some of the multiple, smaller contexts as new patterns in some embodiments. In some other embodiments, the method may further perform pattern analysis on each of the multiple, smaller contexts to determine how these each of the multiple, smaller contexts is represented. If the method determines that at least some of the multiple, smaller contexts are represented by some primitive patterns, the method may then designate at least some of these primitive patterns as new patterns. In some embodiments where the pattern library includes squish patterns, the method may further convert topological patterns into corresponding squish patterns.

FIG. 1A illustrates a high level block diagram for a system for implementing pattern-based design enabled manufacturing of electronic circuit designs in some embodiments. In one or more embodiments, the system for generating multi-layer local maximally spanning routing paths in a fractured space may comprise one or more computing systems 100A, such as a general purpose computer described in the System Architecture Overview section to implement one or more special proposes.

In some embodiments, the one or more computing systems 100A may invoke various system resources such as the processor(s) or processor core(s), memory, disks, etc. The one or more computing systems 100A may also initiate or interact with other computing systems to access various resources 128A that may comprise a global routing engine and/or a detail routing engine 114A, a layout editor 116A, a design rule checker 118A, a verification engine 120A, etc. The one or more computing systems 100A may further write to and read from a local or remote volatile or non-volatile computer accessible storage 112A that stores thereupon data or information such as, but not limited to, one or more data structures or databases (124A) (collectively database or databases hereinafter) such as manufacturing analysis data structure(s) or database(s), design for manufacturing (DFM) data structure(s) or database(s), schematic design database (s), or physical design database(s). The local or remote volatile or non-volatile computer accessible storage 112A may further store thereupon libraries such as a pattern library, data, rule decks, constraints, etc. (122A), or other information or data (126A) that may be used to facilitate the performance of various functions to achieve the intended purposes.

In some embodiments, the one or more computing systems 100A may, either directly or indirectly through various resources 128A to invoke various software, hardware modules or combinations thereof 152A that may comprises a pattern analysis module 102A to identify one or more patterns from an electronic design, a pattern classification module 104A to classify a family of patterns as a single pattern, a DFM module 106A to keep track of various types of information or data related to manufacturing of electronic designs, one or more database modules 108A to store, modify, extract information from and to manage databases, a pattern creation module 110A to create squish patterns, and a transformation module 150A to transform data or information among different formats required by different tools (e.g., from an electronic design automation (EDA) tool to a metrology tool or an electronic design testing equipment), etc.

FIG. 1B illustrates a high level block diagram for a system for implementing pattern-based design enabled manufacturing of electronic circuit designs in some embodiments. More specifically, FIG. 1B shows the electronic design flow (102B) generating and forwarding electronic designs to fabrication (104B) to fabricate the electronic circuits according to the electronic designs. The fabricated electronic circuits are then sent to test and assembly (106B) to ensure that the manufactured electronic circuits meet the requirements. FIG. 1B further shows the manufacturing analytics module 114B which may comprise one or more of the module 152B to feed forward design-based marginalities, the module 154B to perform correlations with defects or manufacturing results, the module 156B to perform systematic tracking or disposition of defect or manufacturing analysis results, the module 158B to perform design analysis or data-mining, and the module 160B to provide data sharing across design, manufacturing, inspection, testing, etc.

FIG. 1B further illustrates that the manufacturing analytics module 114B interacts with the design flow 102B, the fabrication flow 104B, and the test and assembly flow 106B via the DFM/OPC tape-out review (108B), the inspection/metrology module 110B, and the test module 112B respectively. The manufacturing analytics module 114B further interacts with the DFM database 116B that may include the per-design data 118B such as lithography hotspots, process hotspots, pattern match locations, etc. The manufacturing analytics module 114B may also interact with the manufacturing analysis database 120B that may include per-process data 122B which may further include, for example but not limited to, yield limiting patterns, defect or yield correlations, or historical data across designs, across wafers, across processes, or across foundries, etc.

Figure 2:
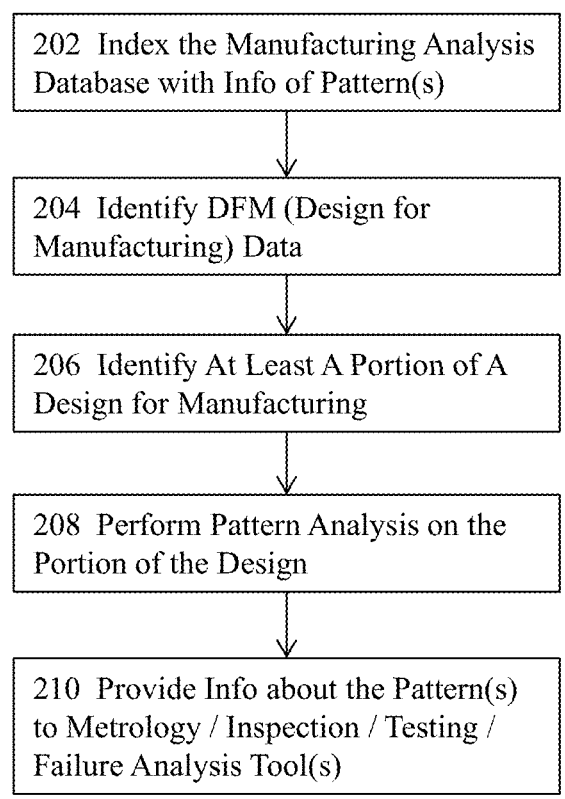
FIG. 2 illustrates a top level flow diagram for implementing pattern-based design enabled manufacturing of electronic circuit designs in some embodiments.

FIG. 2 illustrates a top level flow diagram for implementing pattern-based design enabled manufacturing of electronic circuit designs in some embodiments. In one or more embodiments, the method for implementing pattern-based design enabled manufacturing of electronic circuit designs comprises the process 202 of indexing a manufacturing analysis database with information or data about patterns. In some embodiments, the manufacturing analysis database includes various manufacturing analytics that may include patterns comprising one or more topological patterns, one or more squish patterns, or a combination thereof. The manufacturing analytics may further include information or data that may be derived or extracted from some DFM data and include specific information about a failure or a violation such as the precise location of a circuit feature that caused the failure or violation, precise deviation of a dimension or size from an acceptable or recognized dimension or size.

A topological pattern comprises a geometric representation of a pattern of a portion of an electronic design in a topologically correct manner. A topological pattern may include a geometric pattern as designed with, for example, perfect corners, perfect bends, etc. in some embodiments. A topological pattern may also include an actual image of a portion of a manufactured electronic circuit design in some embodiments. A squish pattern, on the other hand, includes a data structure that includes data that represent a combination of the topological representation and a logical representation of a geometric pattern. More details about squish patterns will be described in subsequent sections.

In some embodiments, the manufacturing analysis database may include data or information other than graphical images. For example, the manufacturing analysis database may also include textual data or symbolic data (e.g., pointers, or symbolic links, etc. between elements of the manufacturing analysis database.) In some embodiments, the method uses topological patterns, squish patterns, or a combination thereof to index the manufacturing analysis database. The database index thus constructed includes a data structure that improves the speed of data retrieval operations on a database table (e.g., a table for the manufacturing analysis database) and may be stored as a separate data structure or as a part of a database table in some embodiments. In some embodiments, an index thus created includes one part of a table and may be created not only on the records of the manufacturing analysis database but also on various functions, which include both native or built-in functions and user-defined functions, or expressions associated with the manufacturing analysis database. In some embodiments, the method may use the indices thus created to support fast query or lookup or to police various explicit or implicit database constraints. In some embodiments, the indices thus created may be unique and may be clustered or non-clustered. In some embodiments, the indices may be created using a plurality of data structures including B+ trees, balanced trees, etc.

In these embodiments, the method may further comprise the process 204 for identifying design for manufacturing data (DFM) from one or more DFM data structures, one or more DFM databases, or a combination thereof. The DFM data may include historical or statistical data of hotspots within one or more contexts in electronic circuit designs. For modern electronic circuit designs, it has been proven to be very difficult, if not entirely impossible, to fix all the printability issues with resolution enhancement techniques (RETs) during OPC (optical proximity correction.) These printability issues which the RETs fail to correct during the OPC stage are referred to as lithography hotspots. Similarly, as a result of a manufacturing process, any regions in the electronic circuit design which may not be reliably corrected with existing methods or subsequent manufacturing processes may be referred to as process hotspots.

A database (DB) may comprise a file composed of records, each including one or more fields together with a set of operations for searching, sorting, recombining, or other functions. A database may also be used to store information in tables—rows and columns of data—and conducts searches by using data in specified columns of one table to find additional data in another table in some embodiments. In such a database, the rows of a table represent records (collections of information about separate items) and the columns represent fields (particular attributes of a record). In conducting searches, such a database matches information from a field in one table with information in a corresponding field of another table to produce a third table that combines requested data from both tables. In these embodiments, such a database uses matching values in two tables to relate information in one to information in the other and is often also referred to as a relational database. Hereinafter, both a data structure and a database (relational or not) will be collectively referred to as a database, unless otherwise specifically recited or claimed. Therefore, the method may identify DFM data from one or more DFM databases at 204.

For example, certain film thickness or topographic variation that exceeds certain threshold numbers may be referred to as a CMP (chemical mechanical polishing) hotspot. Unless otherwise specifically recited or claimed, a hotspot refers to a lithography hotspot, a process hotspot, or a combination thereof throughout the entire application. The DFM data may also include image-based information such as known-good pattern images or known-bad pattern images together with statistics of each piece of image to describe the likelihood or frequency with respect to a specific context within which a certain image printed from a certain design may be relatively sensitive to susceptible to errors. For example, the DFM data may include a known-bad pattern image, the design giving rise to the known-bad pattern image, and/or the statistical data or the historical data of a substantially similar design within a substantially similar context to indicate that the known-bad pattern has, historically or statistically, exhibited certain likelihood or probability of failure. The DFM data may also include one or more known or proven fixes to a known-bad pattern or a known-good pattern to replace the known-bad pattern.

In some embodiments, the method may further comprise the process 206 of identifying at least a portion of an electronic circuit design for manufacturing and the process 208 of performing pattern analysis on the at least a portion of the electronic circuit design. In some of these embodiments, the method may perform squish analysis on the at least a portion of the electronic circuit design at 208 to profile the at least a portion of the electronic circuit design against one or more existing patterns in the manufacturing analysis database or to identify one or more new patterns from the at least a portion of the electronic circuit design. More details about the squish analysis will be described in subsequent sections with reference to various figures.

In one or more embodiments, the method for implementing pattern-based design enabled manufacturing of electronic circuit designs comprises the process 210 of providing information about the patterns in the at least a portion of the electronic circuit design to one or more manufacturing tools that may include, for example, but not limited to, a metrology tool, an electronic circuit inspection tool, an electronic circuit testing equipment, a failure analysis tool, or a combination thereof, etc. In some embodiments, the information provided to the one or more manufacturing tools include, for example, but not limited to, precise location of a failing or rule-violating component (e.g., absolute or relative coordinates of the failing or rule-violating component in the physical design space or in a cell master.) The information provided may further include description of the failure, hint or recommended action(s) to fix the failure or violation, exact deviations of the failing or rule-violating component from acceptable value(s) or range of values, or historical or statistical data about the failing or rule-violating component in the entire electronic circuit design under consideration or in other electronic circuit designs that have been manufactured, etc. in some embodiments. In these embodiments, the method does not merely report that a region in the electronic circuit design contains a failure or violation of a rule or constraint but provides detailed, exact information about the failure or violation together with much more information to further aid the manufacturing processes. For example, the method may provide an exact location of a possible failure site relative to a reference origin of a die to a metrology or inspection tool operator such that the operator is made aware of such possible failure sites and may plan the measurements or inspection accordingly. The information provided may further be used to filter out what is usually a large amount of failure or defect data from the one or more manufacturing tools. The information provided can allow an operator to focus on the failure or defect data that has a higher probability of being systematic due to correlation with a known bad pattern or pattern family.

Figure 3A:
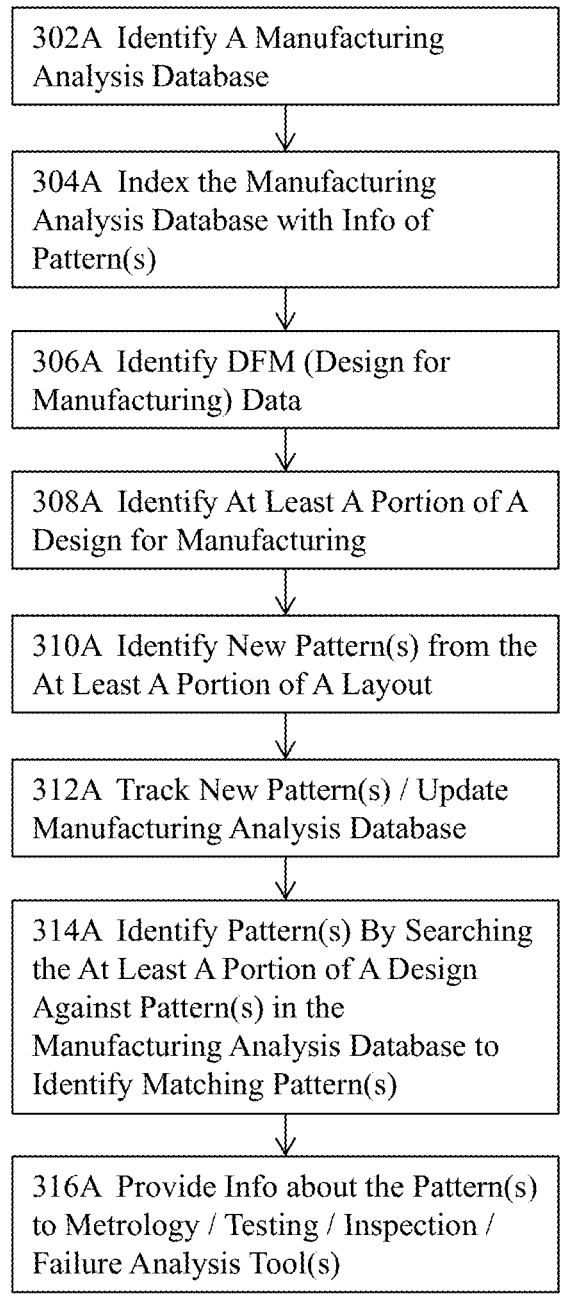
FIG. 3A illustrates a more detailed flow diagram for implementing pattern-based design enabled manufacturing of electronic circuit designs in some embodiments.

FIG. 3A illustrates a more detailed flow diagram for implementing pattern-based design enabled manufacturing of electronic circuit designs in some embodiments. In some embodiments, the method for implementing pattern-based design enabled manufacturing of electronic circuit designs may comprise the process 302A of identifying a manufacturing analysis database. At 304A, the method may comprise the process of indexing the manufacturing analysis database with information or data about patterns in some embodiments. For example, the method may use known-bad topological or squish patterns to index the manufacturing analysis database in some embodiments. In some of these embodiments, the method may also use textual information or data to index the manufacturing analysis database.

In some embodiments, the method for implementing pattern-based design enabled manufacturing of electronic circuit designs may comprise the process 306A of identifying DFM data. The DFM data may include, for example but not limited to, one or more known patterns, historical data or statistical data of the one or more known patterns, one or more fixes for a known-bad pattern, one or more replacement patterns for a known-bad patterns, or any other information about success or failure of manufacturing of a circuit feature in the same electronic circuit design or in one or more other electronic circuit designs with the same or similar circuit feature within the same or similar contexts. In some embodiments, the method for implementing pattern-based design enabled manufacturing of electronic circuit designs may comprise the process 308A of identifying at least a portion of an electronic circuit design. In some embodiments, the method for implementing pattern-based design enabled manufacturing of electronic circuit designs may comprise the process 310A of analyzing the at least a portion of the electronic circuit design to identify one or more new patterns that are not existing in the manufacturing analysis database.

In some embodiments, the method may analyze the at least a portion of the electronic circuit design against existing, known topological or squish patterns in the manufacturing analysis database and identify the remaining area of the portion of the electronic circuit design as a new pattern or as an area for further analysis. The method may then further decompose the area for further analysis into multiple, smaller areas and treat each of the unrecognized smaller area(s) as a new pattern. In some embodiments, the method for implementing pattern-based design enabled manufacturing of electronic circuit designs may comprise the process 312A of tracking at least one new pattern of the one or more new patterns to develop a history for the at least one new pattern. In some embodiments, the method may also track one or more existing patterns in the manufacturing analysis database to develop and maintain the history for each of the one or more existing patterns.

The history may include, for example but not limited to, success or failure of the pattern within one or more contexts or the frequencies or likelihood or probability thereof in one or more electronic designs. The method may further perform statistical analyses on the historical data of a pattern with respect to various other information or data (e.g., similarities or dissimilarities among various contexts, variations or ranges in various parameters such as process parameters, etc.) to determine one or more sensitivities for the pattern with respect to manufacturing objectives (e.g., improving yield, enhancing performance, etc.) or to determine a weight for a pattern with respect manufacturing objectives. In some embodiments, the method for implementing pattern-based design enabled manufacturing of electronic circuit designs may comprise the process 314A of profiling the at least a portion of the electronic circuit design to identify one or more patterns by searching the at least a portion of the design against existing patterns in the manufacturing analysis database to identify one or more matching patterns.

In an example where the manufacturing analysis database includes known-bad patterns, the method may profile the at least a portion of the electronic circuit design to determine whether the at least a portion of the electronic circuit design includes any known-bad patterns that may cause manufacturing issues. In another example whether the manufacturing analysis database includes known-good patterns, the method may profile the at least a portion of the electronic circuit design to determine whether the portion of the electronic circuit design includes any known-good patterns and exclude any matching patterns identified in the portion from further analysis. In some embodiments, the method for implementing pattern-based design enabled manufacturing of electronic circuit designs may comprise the process 316A of providing information or data about the matching pattern (s) to one or more manufacturing tools such as a metrology tool, an inspection tool, a testing equipment, or the failure analysis tool, or to the respective operator thereof. The one or more manufacturing tools or the respective operators thereof may utilize the information to facilitate the performance of their intended functions.

Figure 3B:
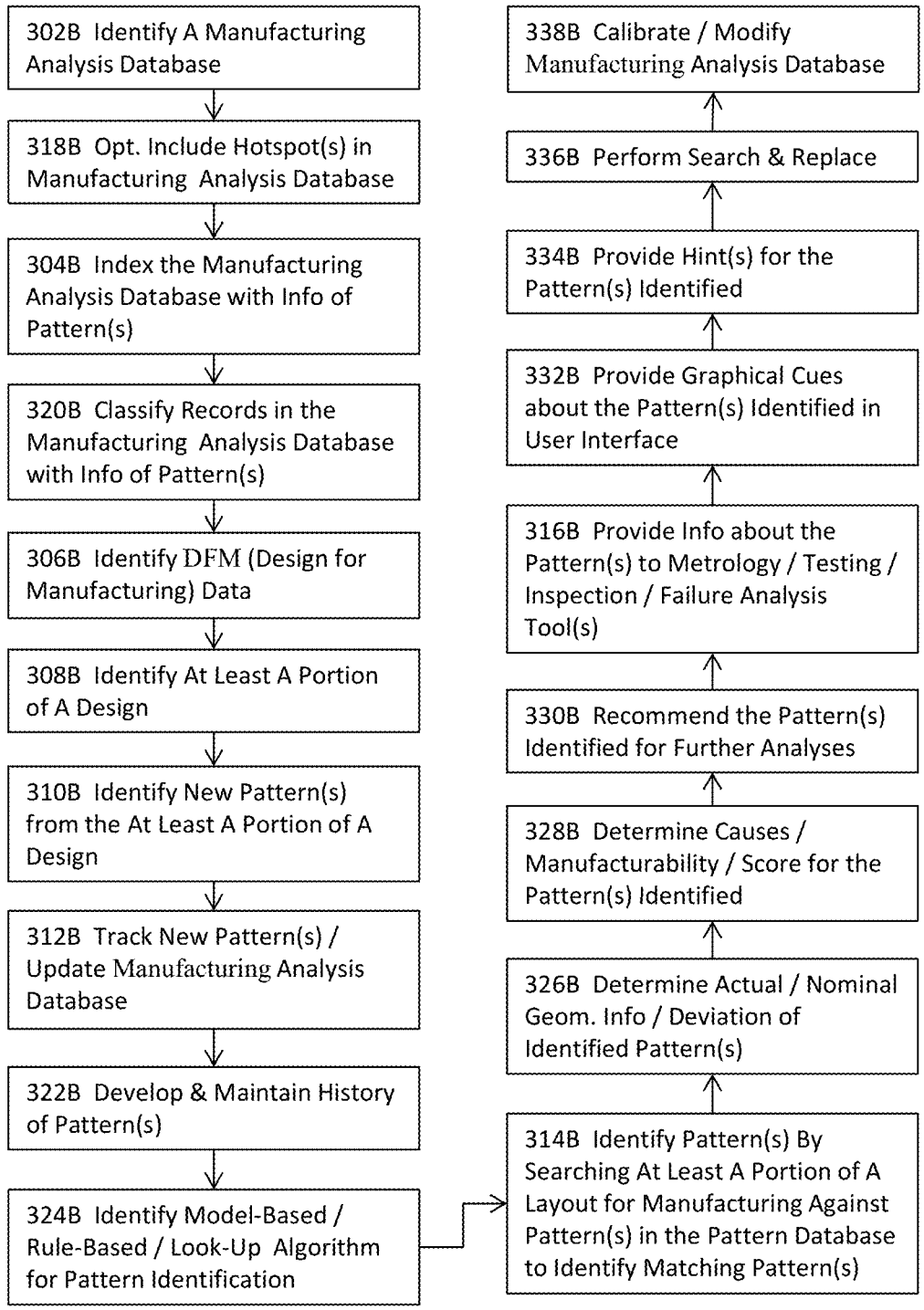
FIG. 3B illustrates a more detailed flow diagram for implementing pattern-based design enabled manufacturing of electronic circuit designs in some embodiments.

FIG. 3B illustrates a more detailed flow diagram for implementing pattern-based design enabled manufacturing of electronic circuit designs in some embodiments. In some embodiments, the method for implementing pattern-based design enabled manufacturing of electronic circuit designs may comprise the process 302B of identifying a manufacturing analysis database including manufacturing analytics. In some embodiments, the method for implementing pattern-based design enabled manufacturing of electronic circuit designs may optionally comprise the process 318B of incorporating one or more hotspots in the manufacturing analysis database. In some embodiments, a hotspot may be captured and represented as a topological pattern, a squish pattern, or an image. A pattern may be a known-good pattern, a known-bad pattern, or a combination thereof.

In some embodiments, the method for implementing pattern-based design enabled manufacturing of electronic circuit designs may comprise the process 304B of indexing the manufacturing analysis database with information about the patterns. In some embodiments, the method may use the patterns as indices to index the manufacturing analysis database. In addition or in the alternative, the method may index the manufacturing analysis database with textual information or data. In some embodiments, the method may use the hotspots as indices to index the manufacturing analysis database. In some embodiments, the method for implementing pattern-based design enabled manufacturing of electronic circuit designs may comprise the process 320B of classifying records in the manufacturing analysis database with information about the patterns or with the patterns themselves and the process 306B of identifying DFM data. Classifying records in the manufacturing analysis database will be described in greater details in subsequent paragraphs.

In some embodiments, the method for implementing pattern-based design enabled manufacturing of electronic circuit designs may comprise the process 308B of identifying at least a portion of a design and the process 310B of identifying one or more new patterns in the portion of the design in substantially the same manner as that described for 308A and 310A. In some embodiments, the method for implementing pattern-based design enabled manufacturing of electronic circuit designs may comprise the process 3128 of tracking the one or more identified new patterns in a substantially similar or identical manner as that described for 312A. In some embodiments, the method may further update the manufacturing analysis database by incorporating the one or more identified new patterns in the manufacturing analysis database. In some embodiments, the method for implementing pattern-based design enabled manufacturing of electronic circuit designs may comprise the process 322B of respectively developing and maintaining history for the one or more identified new patterns. In some embodiments, the method may develop and maintain the history of a pattern based at least in part upon manufacturing data about the pattern from one or more foundries fabricating the pattern in one or more electronic circuit designs.

In some embodiments, the method may track and develop the history of a pattern in the same context or within multiple different contexts across wafers that include the pattern, across multiple, different processes that are used to fabricate the pattern, or across multiple, different electronic designs that include the pattern. In some embodiments, the method for implementing pattern-based design enabled manufacturing of electronic circuit designs may comprise the process 324B of identifying an algorithm for pattern identification or recognition. In some embodiments, the algorithm may include a model-based algorithm which analytically determines whether or not one pattern in a design matches a pre-existing pattern, a rule-based algorithm, or a simple look-up algorithm for pattern identification or recognition. In some embodiments, the method for implementing pattern-based design enabled manufacturing of electronic circuit designs may comprise the process 314B of profiling the portion of the electronic circuit design to identify one or more matching patterns by searching the portion of the electronic circuit design against one or more existing, known patterns in the manufacturing analysis database by using the algorithm identified or determined at 3248.

In some embodiments, the method for implementing pattern-based design enabled manufacturing of electronic circuit designs may comprise the process 326B of determining actual or nominal geometric information or data of a matching pattern or actual or nominal deviation of a dimension or a size of a matching pattern from the corresponding dimension or size of the existing pattern. In some embodiments where the existing patterns comprise patterns that have proven to be acceptable, the process 326B may be used to identify outliers from the patterns that have been designated as acceptable. For example, if the existing pattern includes two interconnect segments with 50-nm-150-nm of spacing in between. The method may identify a matching pattern at 314B, and the process 326B may determine the actual spacing between the two interconnect segments to be 120-nm, 70-nm above the minimal acceptable or known spacing value, or 50-nm less the maximal acceptable or known spacing value. One of the advantages of the process 326B (also 210 and 316A) is that it provides precise geometric information, instead of a binary response (yes or no) of whether or not the matching pattern comply with the requirements of the existing pattern.

In some embodiments, the above existing pattern may also be configured in a way to facilitate design rule checking. For example, the lower bound (e.g., 50-nm) associated with the existing pattern may be configured to represent the minimum spacing between two interconnect segments with a sufficiently large or open upper bound. In this example, any patterns with the spacing values less than the lower bound of the existing pattern are considered as violating the minimum spacing rule. In this example, if the process 310B identifies a pattern with 40-nm spacing between the two interconnect segments and thus identifies such a pattern as a new pattern. The process 310B may also provide the actual or nominal geometric information or data of the new pattern or actual or nominal deviation of a dimension or a size of the new pattern from the corresponding dimension or size of the existing pattern that represents the minimum spacing design rule. That is, the process 310B may provide that the spacing between the two interconnect segments in the new pattern is 10-nm (nominally) below the acceptable minimal spacing value and thus causes a violation. The actual dimensions or sizes of a pattern may be obtained from the manufacturing data generated by the foundries and incorporated in the manufacturing analysis database in some embodiments. In some embodiments, the method for implementing pattern-based design enabled manufacturing of electronic circuit designs may comprise the process 328B of determining possible root cause(s) for the deviation, one or more manufacturability indicators, or one or more numeric or symbolic scores for a pattern identified at 310B or 314B.

The method may further associate the actual manufacturing data (e.g., yield contribution, failure rate, etc. of a specific pattern) or the context(s) within which the pattern resides with the pattern. In some embodiments, the method for implementing pattern-based design enabled manufacturing of electronic circuit designs may comprise the process 330B of recommending the pattern identified at either 310B or 314B for further analysis by, for example, physics-based analytical tools or examination of actual fabrication data about the pattern. In some embodiments where the pattern identification or recognition process produces conflicting or unresolvable results (e.g., a pattern that may match two existing patterns with substantially close probabilities), this further analysis may prove to be particularly helpful in resolving the conflicts. The result of this further analysis may also be used to fine tune or adjust the records in the manufacturing analysis database or the pattern identification algorithms. In some embodiments, the method for implementing pattern-based design enabled manufacturing of electronic circuit designs may comprise the process 3168 of providing information about the pattern identified at 310B or 314B to one or more manufacturing tools in an identical or a substantially similar manner as that described for 210 or 316A.

In some embodiments, the method for implementing pattern-based design enabled manufacturing of electronic circuit designs may comprise the process 332B of providing one or more graphical or textual cues about the pattern identified at 310B or 314B in a user interface. In an example where a matching pattern indicates a violation, the process 332B provides a direct result for the user to visualize what the issues may be, where the issues may be located, and/or how the issues may be resolved. In some embodiments, the method for implementing pattern-based design enabled manufacturing of electronic circuit designs may comprise the process 334B of providing one or more hints or recommendations (hereinafter hints collectively) for the pattern identified at 310B or 314B. In some embodiments, the one or more hints may include one or more known fixes, one or more replacement patterns, specific description of the issue (s) with variable levels of details, precise geometric, physical, or electrical (derived) characteristics of the identified pattern or deviations thereof, or any other useful information that the circuit designer or a manufacturing tool operator may desire or need to know to improve the work flow.

In some embodiments, the method for implementing pattern-based design enabled manufacturing of electronic circuit designs may comprise the process 336B of performing a search and replace process for the pattern identified at 310B or 314B. In some embodiments where squish patterns are used to represent the physical electronic design, the search and replace may comprise toggling certain bits at specific locations. The search and replace process will be described in greater details in subsequent sections with reference to FIG. 9. In some embodiments, the method for implementing pattern-based design enabled manufacturing of electronic circuit designs may comprise the process 338B of calibrating or modifying the manufacturing analysis database or the pattern identification algorithm based at least in part upon the actual fabrication results or one or more further analyses of an identified pattern. For example, the method may identify the pattern with 40-nm spacing between two interconnect segments and designate this pattern as a new pattern because the 40-nm spacing value does not fall with the 50-nm to 150-nm range represented by the existing pattern. Nonetheless, if the new pattern with 40-nm spacing within certain contexts is subsequently proven either through physics-based analyses or actual fabrication results to be manufacturable with same or better yield than the original 50-nm to 150-nm range patterns, the method may update the manufacturing analysis database at 338B to include the 40-nm spacing pattern as an acceptable pattern, at least for those certain patterns.

Figure 4A:
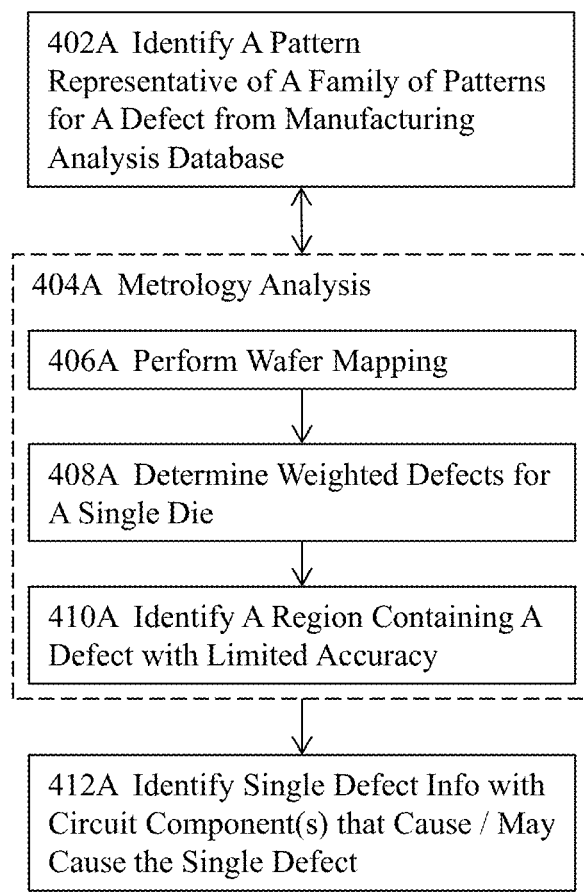
FIG. 4A illustrates a high level flow diagram for implementing pattern-based design enabled manufacturing of electronic circuit designs in some embodiments.

FIG. 4A illustrates a high level flow diagram for implementing pattern-based design enabled manufacturing of electronic circuit designs in some embodiments. In some embodiments, the method for implementing pattern-based design enabled manufacturing of electronic circuit designs may comprise the process 402A of identifying one or more patterns each of which representing a family of patterns for a defect from the manufacturing analysis database. In some of these embodiments, the process 402A identifies the one or more patterns representing the family of patterns by at least performing a pattern analysis on the family of patterns. In some embodiments, the process 402A performs the pattern analysis by considering at least one or more shapes in a pattern in the family of patterns and the respective context within which each of the family of patterns resides. In some of these embodiments, the method identifies the respective context for a pattern in the family of patterns with a halo with defines a region of space around the one or more shapes in a pattern along one or more coordinate axes. For example, the method may consider the expanded space surrounding the shapes in a pattern in the x-direction only, in the y-direction only, or in both the x- and y-direction for a two-dimensional pattern or a two-dimensional construct representing the pattern.

In some embodiments, the method may comprise the process 404A of performing the metrology analysis or inspection with one or more metrology or inspection tools. The process 404A further includes the process 406A of performing wafer mapping to identify one or more problematic dies in a wafer and the process 408A of identifying defects or determining weighted defects based at least in part upon the severity of the violations in a die identified at 406A. The process 404A may also include the process 410A of identifying a region containing a single defect from the identified defects or the determined weighted defects. For example, the process 410A may identify a region containing a more severe defect. The size of the identified region containing the single defect is determined by the resolution, fidelity, or accuracy of the one or more metrology or inspection tools. A modern metrology tool typically has an accuracy of +/−450-nm. In other words, the metrology or inspection process 404A may only identify the region of space containing the defect identified by the metrology or inspection tool with limited resolution. Without additional information, the operator of the metrology or inspection tool may thus need to manually profile the identified region in order to pin point what circuit feature or what net in the region actually causes the violation or failure.

The method for implementing pattern-based design enabled manufacturing of electronic circuit designs may then identify at 412A information about the defect based at least in part upon the one or more patterns that are identified at 402A and correspond to the region of space identified at 410A from the manufacturing analytics in or associated with the manufacturing analysis database. The manufacturing analytics in or associated with the manufacturing database may be derived from the DFM data and thus provides highly accurate data or information about known failures associated with a particular pattern. For example, the manufacturing analytics may provide the precise coordinates of a failing circuit feature, what the failure or violation looks like (e.g., in a form of a printed image of the failing feature as manufactured), how much the failing feature deviates from the acceptable value or the acceptable range of values, description of the violation or failure, or any other data or information that may further assist the metrology or inspection tool operator in performing his or her duties.

In the aforementioned embodiments, the method enables a metrology or inspection tool operator to leverage the manufacturing analytics in or associated with the manufacturing analysis database to eliminate or at least reduce any guesses or guesstimates by the operator for possible failure sites and to eliminate the laborious or time-consuming manual process to profile the region of space containing the failure. The precise and highly accurate information about the failure or violation not only helps the electronic circuit design team to find possible root causes of a violation or a failure and thus to better design electronic circuits without compromising the yield but also helps the foundries to better fine tune their fabrication processes to reduce or even eliminate various hotspots caused by their fabrication processes.

Figure 4B:
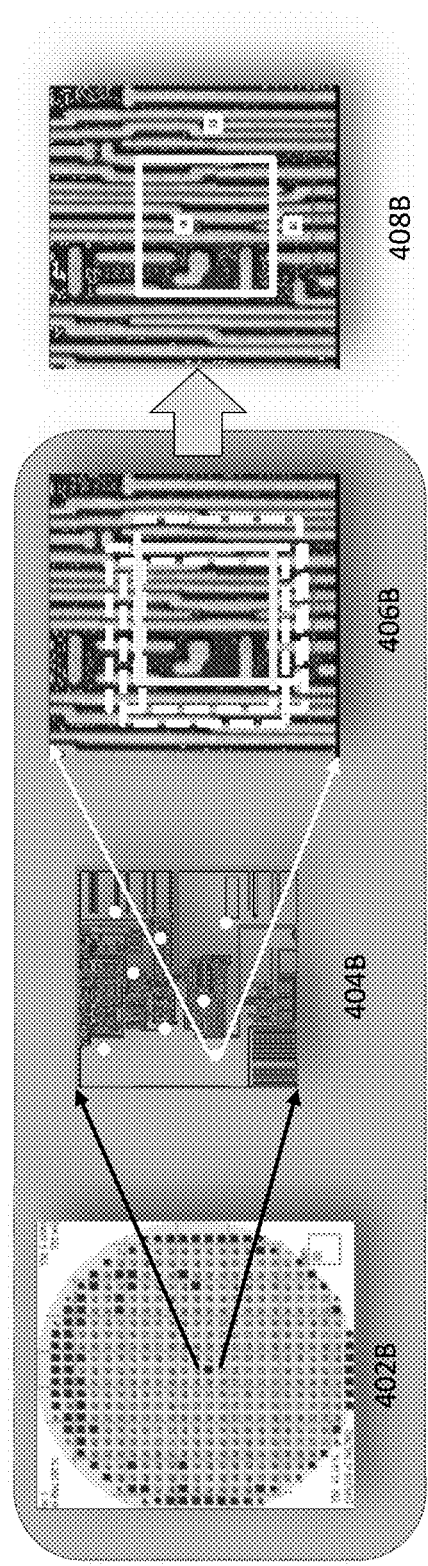
FIG. 4B illustrates a schematic flow diagram for implementing pattern-based design enabled manufacturing of electronic circuit designs in some embodiments.

FIG. 4B illustrates a schematic flow diagram for implementing pattern-based design enabled manufacturing of electronic circuit designs in some embodiments. In FIG. 4B, 402B illustrates a schematic representation of a wafer mapping result that may be generated by, for example, process 402A. 404B illustrates an exemplary image of a single die with weighted defects shown as white dots in 404B. 406B depicts a region of space in the single die containing a single defect. As it can be seen from 406B, the region of space containing the single defect is of some relatively large size due to the limitation in accuracy of modern metrology or inspection tools. 408B shows potential sites of failure or violation that are represented by small white squares by leveraging the pattern analysis and the manufacturing analytics. These potential sites of failure or violation are overlaid on top of the printed image of the region of space to provide further assistance to the operator of the metrology or inspection tool.

Figure 5A:
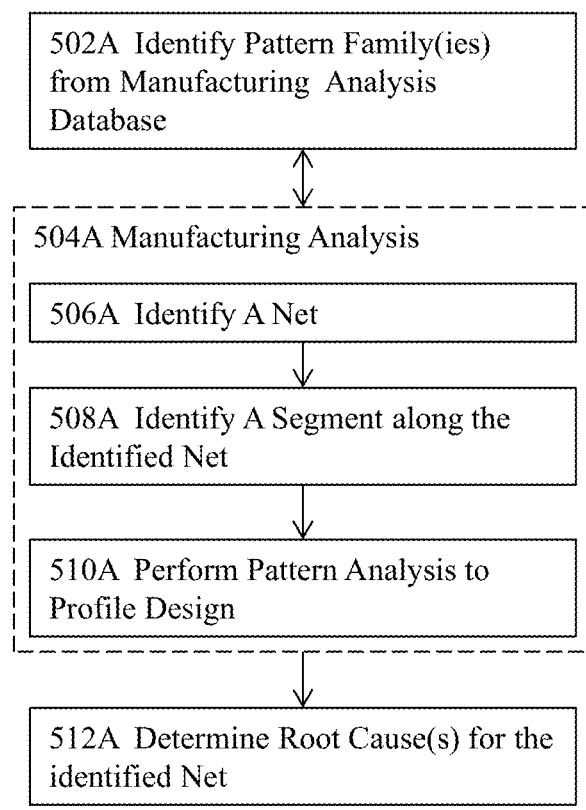
FIG. 5A illustrates a high level flow diagram for implementing pattern-based design enabled manufacturing of electronic circuit designs in some embodiments.

FIG. 5A illustrates a high level flow diagram for implementing pattern-based design enabled manufacturing of electronic circuit designs in some embodiments. In some embodiments, the method depicted in FIG. 5A may be used to perform yield analysis. In one or more embodiments, the method may comprise the process 502A of identifying one or more patterns each of which represents a family of patterns from a manufacturing analysis database. In some embodiments, the manufacturing analysis database includes squish patterns. In some of these embodiments, the process 502A identifies the one or more patterns by performing at least a pattern analysis on an electronic design of interest (e.g., the electronic design on which the manufacturing analysis is performed at 504A.) In some embodiments, the method may further comprise the process 504A of performing the manufacturing analysis on an electronic design. In some of these embodiments, the manufacturing analysis comprises yield analysis to determine the yield of the electronic design. In some embodiments, the process 504A may comprise the process 506A of identifying a net that is determined to have failed or to have violated one or more design rules or constraints. The process 504A may further comprise the process 508A of identifying a segment along the identified net.

In some embodiments, the process 508A may identify the net or the segment along the net by performing scan chain analyses or other design for testing (DFT) analyses. In some embodiments, the process 504A may further comprise the process 510A of performing pattern analysis to profile at least a portion of the electronic design containing the net or the segment along the net in order to identify or determine one or more patterns from the manufacturing analysis database. In some of these embodiments, the pattern analysis may be performed by further incorporating one or more contexts surrounding the net or the segment of the net to identify one or more existing patterns that exactly or approximately match the net or the segment with the one or more contexts. For example, the method may consider a halo that expands for a fixed distance or variable distances in one or more directions with respect to the net or the segment to define a context for the net or segment in some embodiments. It shall be noted that the pattern analysis may be performed in advance to identify patterns used in the electronic design, rather than during the manufacturing analysis in some embodiments. In these embodiments, the one or more patterns that exactly or approximately match the pattern containing the net or the segment in the electronic design may be quickly identified or looked up by using, for example, the reference coordinates of the region.

In some embodiments, the method may further identify additional information for the one or more existing patterns corresponding to the net or the segment along the net from the manufacturing analytics in or associated with the manufacturing analysis database and provide the additional information for further analysis to determine possible root causes for the net. For example, the manufacturing analytics may provide the precise coordinates of a failing circuit feature, what the failure or violation looks like (e.g., in a form of a printed image of the failing feature as manufactured), how much the failing net or segment deviates from the acceptable value or the acceptable range of values, description of the violation or failure, process recipes or parameters used in prior fabrication of identical or similar features, likelihood or percentage of failure or violation of prior runs, or any other data or information that may further assist the metrology or inspection tool operator in performing his or her duties. The manufacturing analysis may then examine the provided additional information to determine possible root causes of the failure or violation. For example, the manufacturing analysis may determine that the difference in a process parameter may be one of the root causes for the failure or violation. The foundries may then determine whether or not the process parameter is to be changed for subsequent runs in order to eliminate the failure or violation.

Figure 5B:
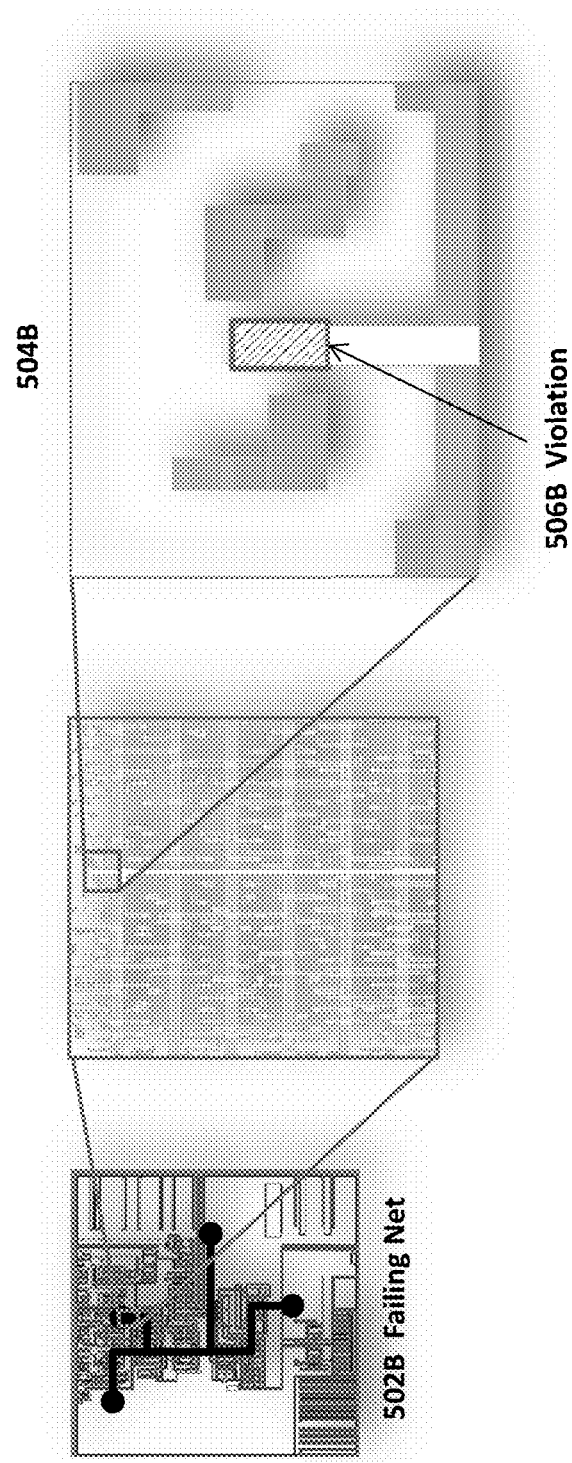
FIG. 5B illustrates a schematic flow diagram for implementing pattern-based design enabled manufacturing of electronic circuit designs in some embodiments.

FIG. 5B illustrates a schematic flow diagram for implementing pattern-based design enabled manufacturing of electronic circuit designs in some embodiments. More specifically, 502B depicts the identification of a failing net in a region of an electronic design. 504B shows that the method leverages the manufacturing analytics in or associated with the manufacturing analysis database to identify an existing pattern that exactly or approximately matches the pattern in the electronic design and to overlay a known failure associated with the existing pattern at the precise location in the display.

Figure 5C:
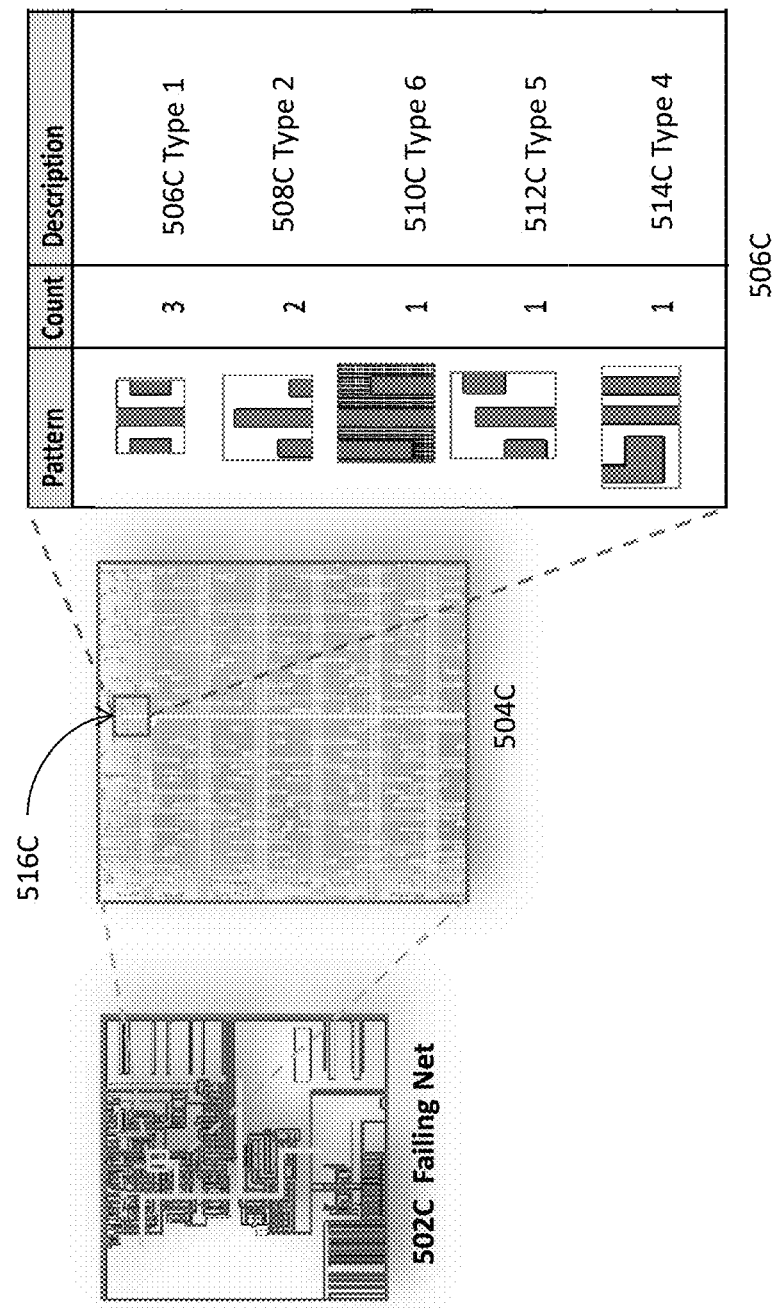
FIG. 5C illustrates a schematic flow diagram for implementing pattern-based design enabled manufacturing of electronic circuit designs with exemplary output information in some embodiments.

FIG. 5C illustrates a schematic flow diagram for implementing pattern-based design enabled manufacturing of electronic circuit designs with exemplary output information in some embodiments. More specifically, 502C depicts the identification of a failing net; and 504C illustrates the identification of a segment along the failing net. 506C shows a list of exact or approximate matching patterns (506C, 508C, 510C, 512C, and 514C) that are identified from the manufacturing analysis database and the number of occurrences of each matching pattern in the area of interest 516C. In some embodiments, the method may further determine the absolute or relative probability for each matching pattern based at least in part upon one or more contexts in the area of interest or the respective context within which each of the matching pattern resides. For example, the method may determine that Type 2 (508C) has a 24% probability of matching the pattern of interest in the electronic design, or Type 5 (512C) is "most likely" to match the pattern in the area of interest 516C. In some embodiments, the method may present the number of occurrences of each matching pattern symbolically, rather than showing the exact number of occurrences of each matching pattern. For example, the method may use "very common", "rare", etc. to represent the frequencies of the matching patterns.

Figure 5D:
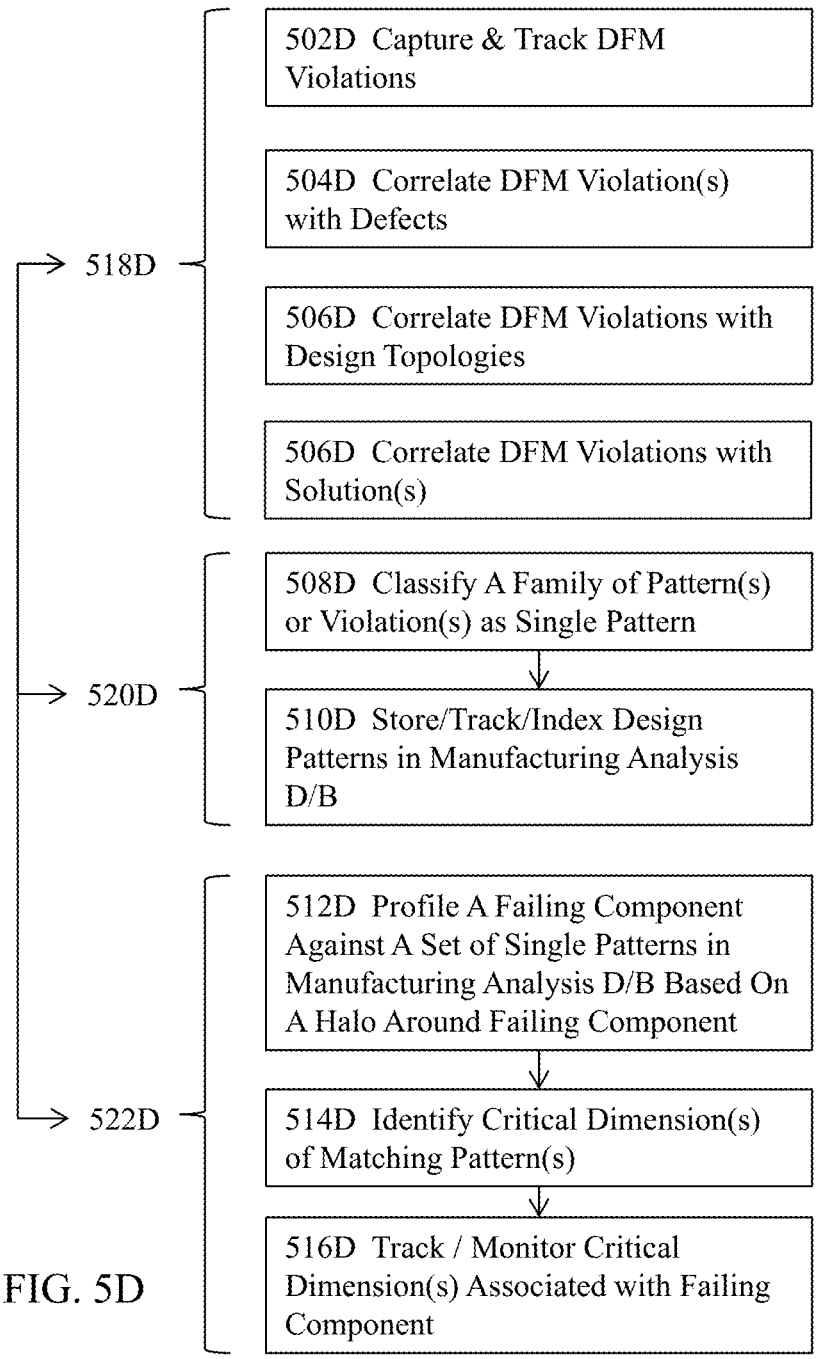
FIG. 5D illustrates a flow diagram for implementing pattern-based design enabled manufacturing of electronic circuit designs in some embodiments.

FIG. 5D illustrates a flow diagram for implementing pattern-based design enabled manufacturing of electronic circuit designs in some embodiments. More specifically, the method described herein may invoke the process 518D to manipulate the DFM (design for manufacturing) database. The process 518D may comprise the process 502D of capturing or tracking one or more DFM violations or failures across different wafers, across different processes, across different electronic designs, or across different foundries in some embodiments. In these embodiments, a DFM violation or failure is associated with or captured as a pattern (e.g., a topological pattern, a squish pattern, or an actual, printed image of the topological or squish pattern) that may be stored in the manufacturing analysis database. The manufacturing analysis database may further include or correspond to additional manufacturing analytics as described above and may be indexed by various patterns that may include the patterns representative of DFM violations or failures. Therefore, the method may track these pattern-based DFM violations or failures across different wafers, different processes, different electronic designs, or even different foundries in these embodiments.

The process 518D may comprise the process 504D of correlating or tracking a DFM violation or failure to one or more defects by associating a DFM violation or failure (e.g., captured as a pattern as described above) with the relevant manufacturing analytics that may grow as the same or similar pattern is used or manufactured more often. The process 518D may comprise the process 506D of correlating DFM violations or failures with design topologies by using, for example, a pointer, a link, or any other programming language data type whose value refers to another value stored elsewhere to correlate the DFM violations with the design topologies. The process 518D may comprise the process 506D of correlating a DFM violation or failure with one or more solutions (e.g., RET or OPC solutions or one or more replacement patterns) that may be used to resolve the DFM violation or failure. With the process 518D, the method may then interrelate the DFM violations or failures, manufacturing analytics, specific defects, design topologies, and solution techniques with each other and freely share various information or data among design, metrology, inspection, and testing.

The method described herein may also invoke the process 520D to classify a family of different patterns as a single pattern at 508D and persistently store the single pattern in a data structure (e.g., the manufacturing analysis database) to track the single pattern or to develop and maintain history for the single pattern at 510D. In some embodiments, the process 520D may classify a family of violations as a single pattern. In these embodiments, the single pattern is used to represent the family of violations. The process 520D may further index a database (e.g., the manufacturing analysis database) with the single patterns designated at 508D.

The method described herein may also invoke the process 522D for performing design pattern-based design analyses in some embodiments. The process 522D may include the process 512D of profiling a failing component by comparing at least the failing component against a set of single patterns in the manufacturing analysis database to identify one or more matching patterns in some embodiments. In some of these embodiments, the process 522D may profile a failing component by considering, in addition to the failing component, one or more contexts with which the failing component resides. In some embodiments, the process 512D may use a halo that defines a context by expanding from the failing component in one or more directions. The process 522D may also include the process 514D of identifying one or more critical dimensions from the one or more matching patterns and the process 516D of tracking or monitoring the corresponding one or more critical dimensions associated with the failing component to keep the corresponding one or more critical dimensions in check in some embodiments.

Figure 5E:
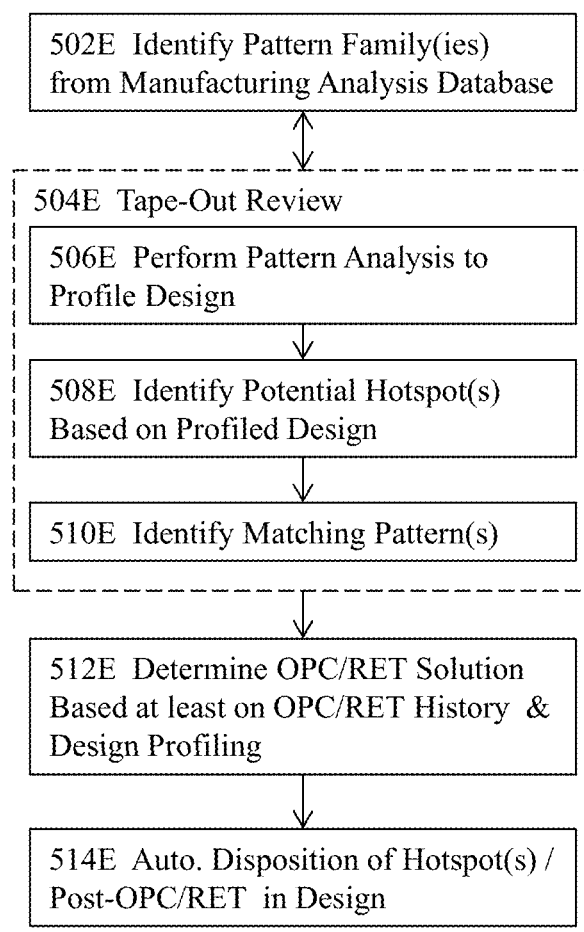
FIG. 5E illustrates a flow diagram for implementing pattern-based design enabled manufacturing of electronic circuit designs in some embodiments.

FIG. 5E illustrates a flow diagram for implementing pattern-based design enabled manufacturing of electronic circuit designs in some embodiments. In one or more embodiments, the method for implementing pattern-based design enabled manufacturing of electronic circuit designs may comprise the process 502E of identifying one or more patterns, each of which represents a family of patterns, from the manufacturing analysis database. For example, the process 502E may identify multiple patterns, each of which represents a hotspot. In some embodiments, the one or more patterns include one or more squish patterns. A squish pattern will be describe in greater details in subsequent paragraphs and generally refers to a pattern that includes a combination of a topological representation and a logical representation of a geometric pattern in an electronic design. A squish pattern may also include parameterized attribute(s), ranged attribute(s), or attribute(s) with a discrete set of values representing one or more geometric characteristics of the geometric pattern in the electronic design. The method may further include the process 504E of performing tape-out review.

In some embodiments, the process 504E includes the process 506E of profiling an electronic design by performing a pattern analysis on the electronic design with the one or more patterns identified at 506E. In some of these embodiments, the process 504E may use one or more contexts or halos on at least one of the one or more patterns in profiling the electronic design. The process 504E may further include the process 508E of identifying potential hotspots in the electronic design based at least in part upon the results of profiling the electronic design with the one or more patterns identified at 502E in some embodiments. At 510E, the process 504E may identify one or more exact or approximate matching patterns from, for example, the manufacturing analysis database in some embodiments.

In some of these embodiments, the process 504E may further determine the respective probability or confidence level for each of the one or more matching patterns. The probability or confidence level arises due to the limited extent of each pattern considered and also due to the extent of the context or the halo considered. In some embodiments, the method may further comprise the process 512E of determining one or more solutions (e.g., OPC solution, RET solution, etc.) based at least in part upon the history of applying the one or more solutions to fix an identical or a similar problem or upon the results of profiling the electronic design at 506E. In some embodiments, the method may further include the process 514E of automatic disposition or overlay of hotspots in the display window showing one form of the electronic design (e.g., in a window showing the layout of the electronic design, in a window showing the metrology or inspection result of the manufactured electronic design, etc.)

Figure 6:
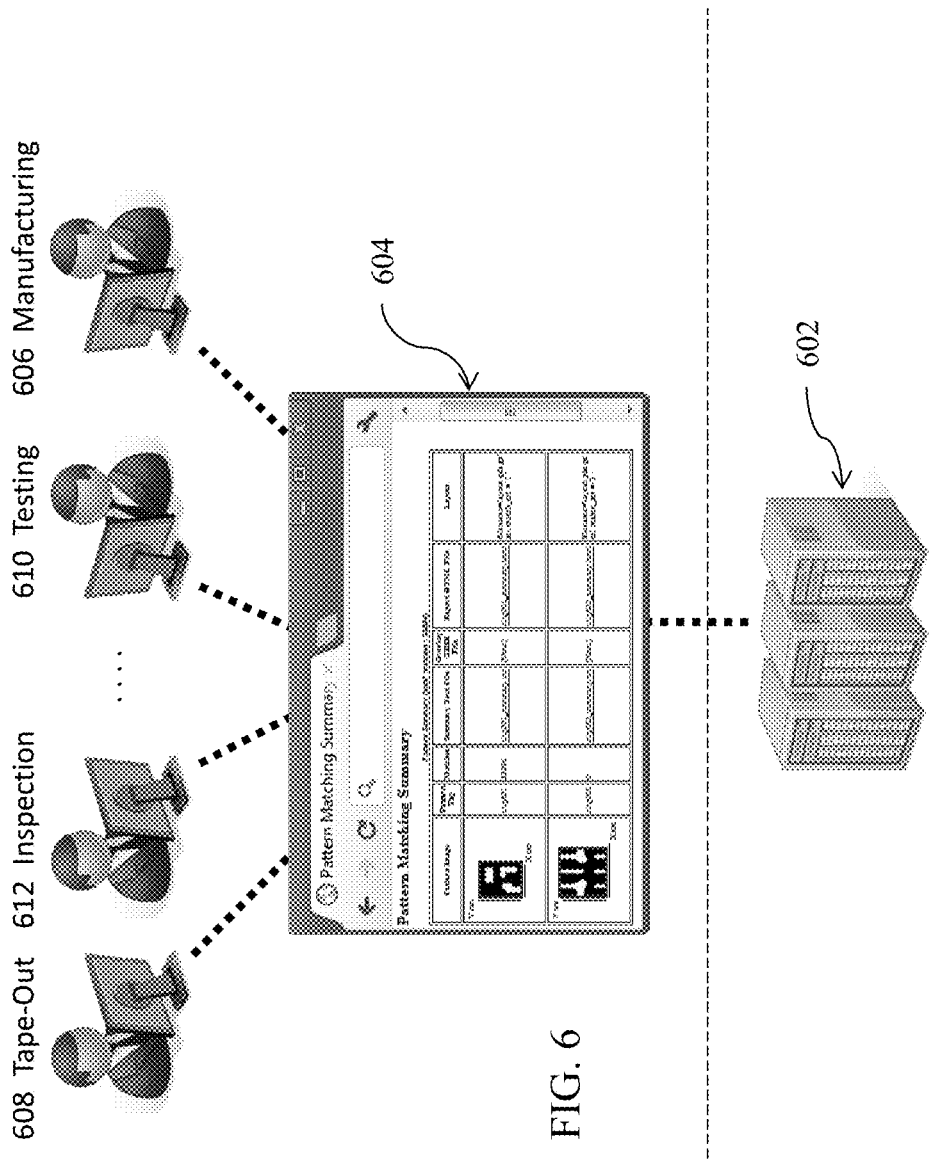
FIG. 6 illustrates a high level diagram for implementing pattern-based design enabled manufacturing of electronic circuit designs with manufacturing analytics in some embodiments.

FIG. 6 illustrates a high level diagram for implementing pattern-based design enabled manufacturing of electronic circuit designs with manufacturing analytics in some embodiments. More specifically, the manufacturing analytics 602 in or associated with the manufacturing analysis database residing on one or more computing systems may be implemented as a software as a service (SaaS) that may be accessed by and shared among, for example, the tape-out or circuit design team 608, the inspection team 612, the testing team 610, the manufacturing team 606, etc.

Figure 7A:
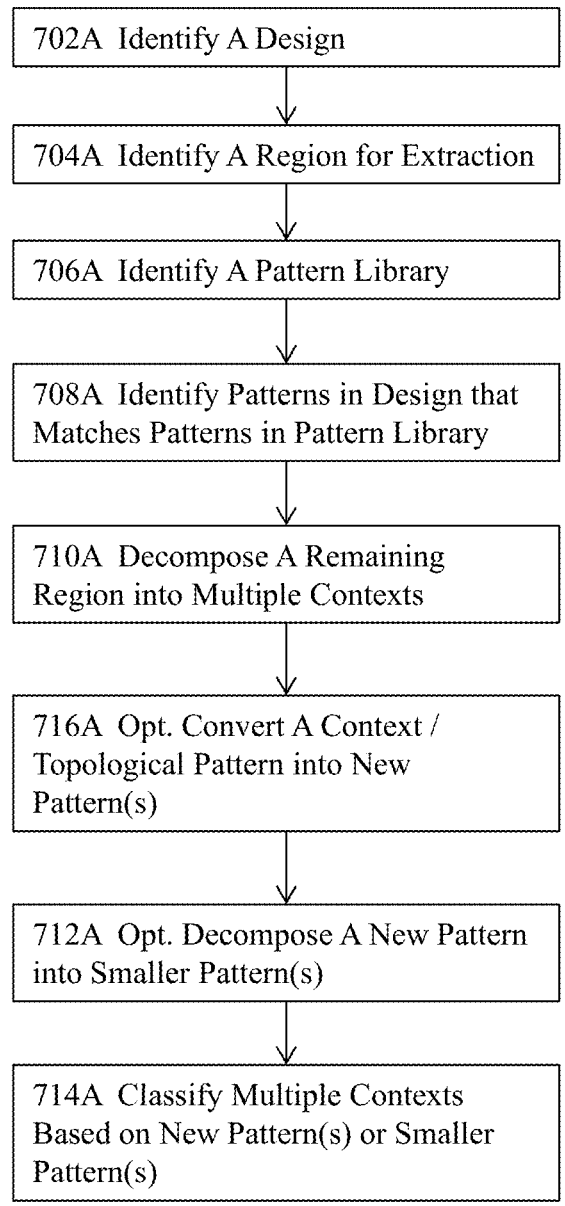
FIG. 7A illustrates a high level flow diagram for implementing pattern classification of electronic circuit designs in some embodiments.

FIG. 7A illustrates a high level flow diagram for implementing pattern classification of electronic circuit designs in some embodiments. More particularly, FIG. 7A illustrates a process flow for implementing pattern classification with squish patterns. In some embodiments, the method for implementing pattern classification of electronic circuit designs depicted in FIG. 7A comprises the process 702A of identifying an electronic design. At 704A, the method may further comprise the process of identifying a region for extraction. In some embodiments, the method may further comprise the process 706A of identifying a pattern library from, for example, a database such as a manufacturing analysis database or a DFM database comprising known-good or known-bad patterns. In some embodiments, the method may further comprise the process 708A of identifying one or more patterns in the electronic design that match an existing pattern in the pattern library and the process 710A of decomposing the remaining region in the electronic design that does not correspond to any recognized patterns in the pattern library into multiple, smaller contexts, each of which comprises a new pattern. In some embodiments, the method may further optionally comprise the process 716A of converting one or more contexts with some degree of commonality into a squish pattern.

In some embodiments where squish patterns are used to represent the electronic design, the optional process 716A will be performed to convert topological patterns into corresponding squish patterns. An example conversion of a topological pattern into a corresponding squish pattern is described below with reference to FIG. 7D. In some embodiments, the method may further comprise the process 712A of optionally decomposing a new pattern into multiple smaller patterns. An example of such a conversion process In some embodiments, the method may further comprise the process 714A of classifying the multiple contexts in the remaining region by using the new patterns or the multiple, smaller patterns and adding one or more patterns that are most used to represent the remaining region as a new pattern to the pattern library. An exemplary working example is described with reference to FIGS. 7D-G below. In some embodiments, a pattern referred to in the method illustrated in FIG. 7A above may comprise a topological pattern or a squish pattern.

Figure 7B:
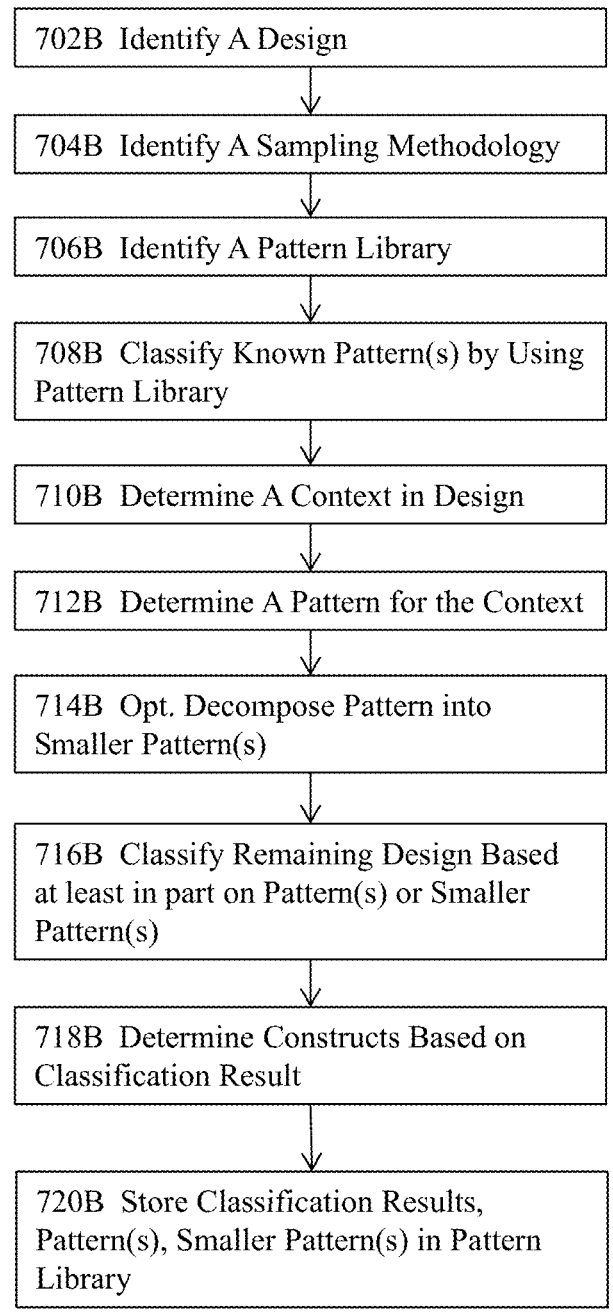
FIG. 7B illustrates a more detailed flow diagram for implementing cross-design pattern classification of electronic circuit designs in some embodiments.

FIG. 7B illustrates a more detailed flow diagram for implementing cross-design pattern classification of electronic circuit designs in some embodiments. In one or more embodiments, the method for implementing cross-design pattern classification of electronic circuit designs may comprise the process 702B of identifying an electronic design. In some embodiments, the electronic design may be represented by one or more topological patterns, each of which includes geometrically correct shapes representing various circuit features in the topological pattern. In some other embodiments, the electronic design may be represented by one or more squish patterns, each of which includes a data structure that includes data that represent a combination of the topological representation and a logical representation of a topological pattern. Yet in some other embodiments, the pattern of interest may comprise an actual printed image of a topological pattern.

In some embodiments, the method may further comprise the process 704B of identifying a sampling methodology or algorithm such as the algorithm identified at process 324B and the process 706B of identifying a pattern library. In some embodiments, the pattern library includes a canonical set of unique patterns or a set of the minimum number unique patterns that may be used to represent known designs. In some embodiments, the method may further comprise the process 708B of classifying the electronic design to identify patterns in the electronic design that match the existing patterns in the pattern library. The areas represented by these identified patterns in the electronic design are thus excluded from consideration because they are already represented by known, existing patterns in the pattern library in some embodiments. In some embodiments, the method may further comprise the process 7108 of determining one or more contexts in the remaining region of the electronic design. In some embodiments, the process 7108 may determine the one or more contexts by partitioning the remaining region into the one or more contexts. In some embodiments, the method may further comprise the process 712B of determining a pattern for each of the one or more contexts.

In some embodiments where the pattern library includes only topological patterns, the process 712B may simply treat each context of the one or more contexts as a pattern. In some embodiments where the pattern library includes only squish patterns, the process 712B may perform pattern analysis on the one or more contexts and classify a family of patterns with certain commonality (e.g., two patterns, each including two vertical interconnect segments, only differ in the spacing between the two vertical interconnect segments) as a single pattern and represent the single pattern with a n-dimensional data structure, such as a two-dimensional array in this example, having a binary choice of values in each field of the n-dimensional data structure to indicate which fields are occupied by actual circuit features and which fields represent empty space and a range of values or a set of discrete values for certain fields signifying that certain dimensions of some patterns represented by the single pattern may assume the values in the range or the set. In some embodiments, the method may further optionally comprise the process 714B of decomposing a pattern determined at 712B into multiple, smaller patterns.

One of the objectives of decomposing a pattern into smaller patterns is to find one or more smaller patterns that may be used to represent more other patterns in an electronic circuit design. In some embodiments, the method may further comprise the process 7168 of classifying the remaining region or one or more contexts thereof in the electronic design by using at least the pattern determined at 712B or at least some of the multiple, smaller patterns determined at 714B. For example, the process 7168 may classify each context into one or more of the multiple smaller patterns plus one or more additional patterns. In some embodiments, the method may further comprise the process 718B of performing pattern analysis on the remaining region of the electronic design to determine one or more patterns or one or more pattern constructs based at least in part on the results of classifying the remaining region. In some embodiments, the process 718B may determine that the most frequently used patterns are to be designated as new patterns. In some other embodiments, the process 718B may designate all the patterns identified or determined at 712B and 714B as new patterns. At 720B, the method may further persistently store the classification results, the new patterns determined at 712B, or the new, smaller patterns determined at 714B.

Figure 7C:
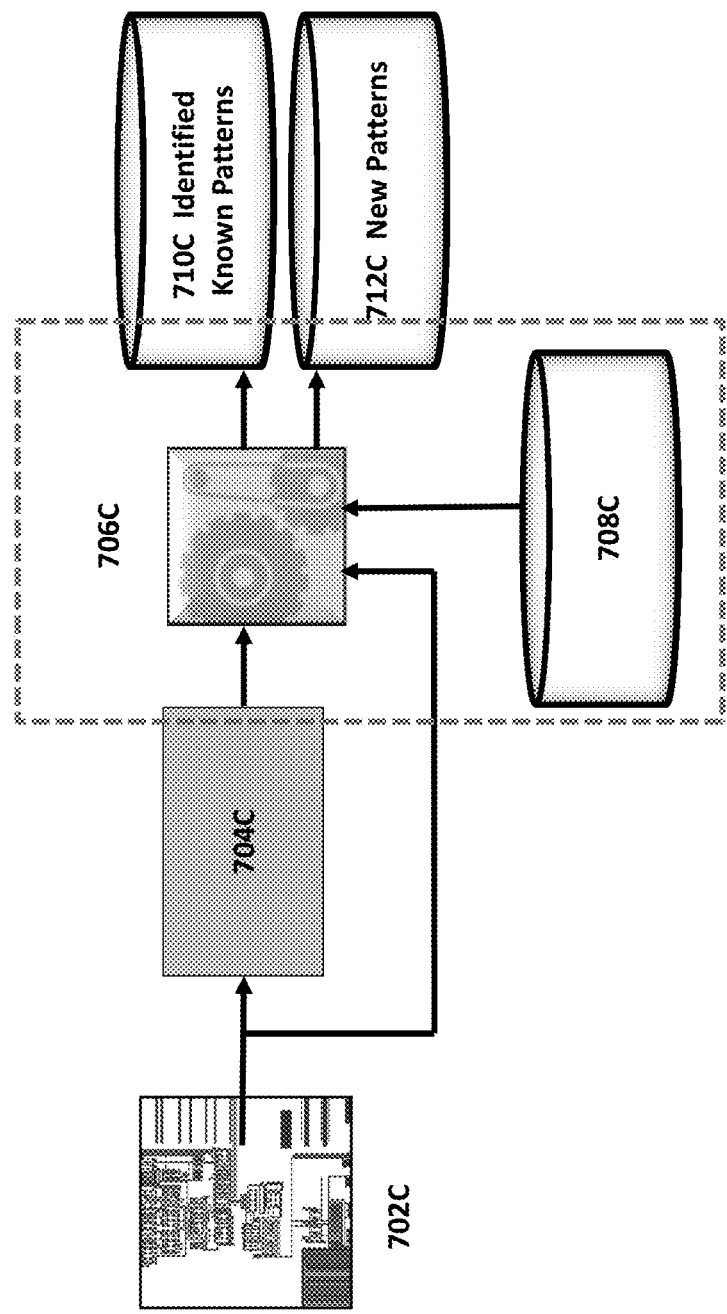
FIG. 7C illustrates a schematic flow diagram for implementing cross-design pattern classification of electronic circuit designs in some embodiments.

FIG. 7C illustrates a schematic flow diagram for implementing cross-design pattern classification of electronic circuit designs in some embodiments. More specifically, 702C represents a new electronic design in, for example, GDS II or OASIS format. 704C represents the design sampling or profiling module that may be invoked to profile the new design 702C. The rectangle with dashed lines encloses the pattern classification module 706C that works in conjunction with the design sampling or profiling module 704C to identify patterns from the electronic design 702C that match one or more existing patterns in the pattern library 708C. In some embodiments, the pattern library 708C may be included in the manufacturing analysis library described above and including various patterns and their associated information or data. The design sampling or profiling module 704C and the pattern classification module 706C may then identify one or more patterns 710C from the electronic design that match one or more patterns in the pattern library 708C as well as determine one or more new patterns 712C that do not match any of the existing patterns in the pattern library 708C.

Figure 7D:
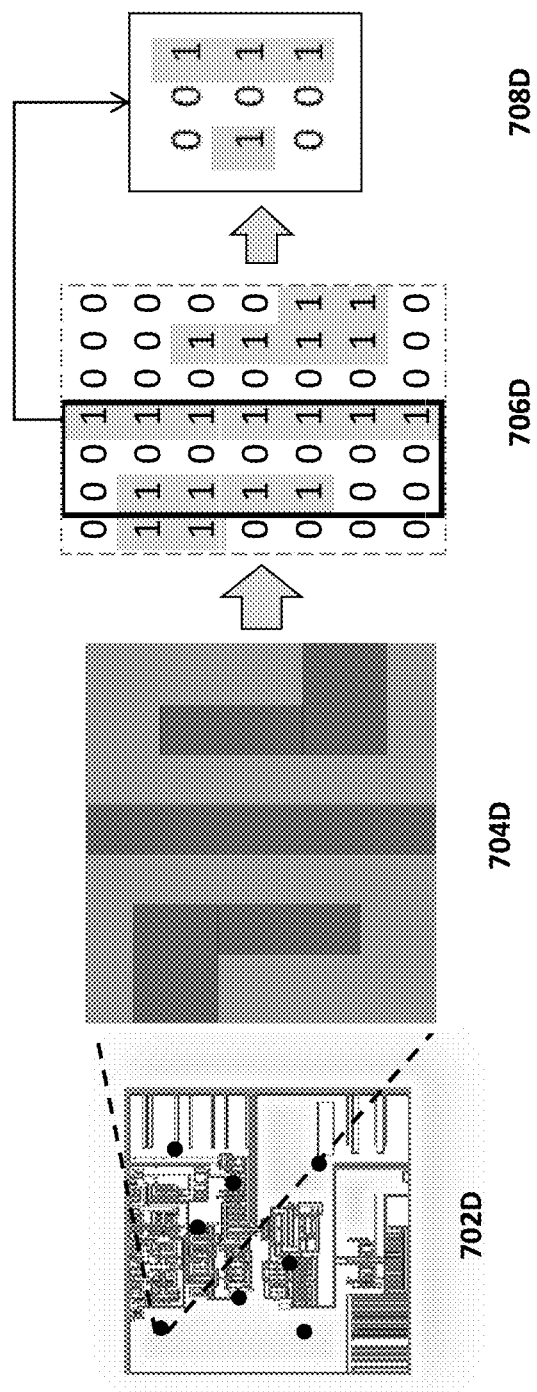
FIG. 7D illustrates an exemplary squish pattern and a decomposed candidate squish pattern for a portion of an electronic circuit design in some embodiments.

FIG. 7D illustrates an exemplary squish pattern and a decomposed candidate squish pattern for a portion of an electronic circuit design in some embodiments. More specifically, 702D illustrates an electronic design (e.g., a taped-out design); 704D depicts a topological pattern including five rectangular shapes that have correct geometric dimensions representing as drawn shapes in the electronic design. 706D represents a 7×7 squish pattern for the topological pattern 704D. As it can be seen from 706D, the squish pattern includes a two-dimensional data structure having seven columns and seven rows and thus a total of 49 fields. Each field in this exemplary squish pattern has either the value "0" or "1". In the exemplary squish pattern, each field in a column having a value "1" corresponds to a physical feature physically occupying a space in the electronic design. The width and length of a field respectively correspond to a width and length of a primitive circuit element in the physical design. Those skilled in the art will recognize that this approach can be extended to a multi-layer pattern in a similar way. In a multi-layer pattern, each field in this exemplary squish pattern can have either the value "0" or "1" on a per-layer basis. In some implementations this can be represented as a single binary number where the bit position represents the layer (e.g. "101" corresponds to a field which is occupied by geometry on the bottom and top layer but which is space in the middle layer). Those skilled in the art will further recognize that this approach can support inexact matching by introducing a don't care value (e.g. "X") in addition to the "0" or "1". A field with an "X" can therefore be either a "0" or a "1".

For example, the first column from the left has the value "1" in the fields (2, 1) and (3,1), and the second column from the left has the value "1" in the fields (2, 2)-(5, 2). This representation indicates that the physical length of the shape corresponding to the second column from the left is twice of that corresponding to the first column from the left. Therefore, the squish pattern 706D resembles the topological pattern 704D, and although the squish pattern 706D only has some "1"'s and "0"'s in the 7×7 data structure, the squish pattern also preserves the correct geometric characteristics of the topological patterns and thus may be used to represent a part of the electronic design. 708D illustrates an exemplary decomposed 3×3 squish pattern that may be derived from the 3×7 array enclosed by the solid black rectangles in the squish pattern 706D. It shall be noted that in the first column from the left, only the field (2, 1) has the value "1", and the first column from the right only has three rows, instead of seven as in 706D. The decomposed pattern may be represented in a way that the second row takes on the integer values belonging to the range [1, 4], inclusive, and the third row also takes on the integer values belonging to the range [1, 2], inclusive. Therefore, the squish pattern 708D may be used to correctly represent the topological pattern and hence the electronic design with the ranges so specified.

FIG. 7E illustrates an exemplary pattern classification result for a portion of an electronic circuit design in some embodiments. More specifically, FIG. 7E shows the five contexts A-E in the first column from the left of the data structure 700E. The second column entitled "Squish Patterns in Context" shows the pattern analysis results of each of the five contexts. FIG. 7E further shows that the method (e.g., 718B) may designate the first squish pattern 702E as the squish pattern to be persistently stored in the pattern library in some embodiments because the pattern 702E is used to represent at least a part of three contexts. The method (e.g., process 718B) may also designate the top two squish patterns—both the first squish pattern 702E and the second squish pattern 704E—as the squish patterns to be persistently stored in the pattern library in some embodiments or all of the squish patterns identified in 700E as the patterns to be persistently stored in the pattern library in some other embodiments.

Figure 7F:
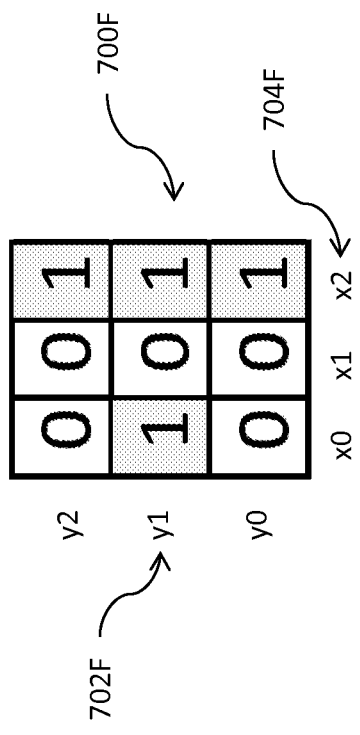
FIG. 7F illustrates an exemplary output for an exemplary analysis of a portion of an electronic circuit design in some embodiments.

FIG. 7F illustrates an exemplary output for an exemplary analysis of a portion of an electronic circuit design in some embodiments. More specifically, FIG. 7F illustrates that the method may report a variety of useful data about a pattern 700F that represents some patterns in an electronic design. For example, in the exemplary output illustrated in FIG. 7F, the method may report how many contexts ("sits covered: 100") are covered by the squish pattern 700F in an electronic design or a portion thereof, the precise representative location of the squish pattern in the electronic design or a portion thereof ("loc: [4291 4995 4641 5145]"), the aggregate range of values in the x-direction 704F ("x_deltas=1 50-150 1"), the aggregate range of values in the x-direction 702F ("y_deltas=1 50-1981"), and what specific values are observed and how often these values are observed (e.g., "y1: 50:647 52:2 60:1 61:4 64:2 66:177 68:40 74:2 76:4 110:7 118:1 133:1 150:35 166:8 198:7" indicates there are 647 instances of the squish pattern with the 50-nm spacing and seven instances of the squish pattern 700F with the 198 nm spacing.)

Moreover, the "rulename" in FIG. 7F indicates the use of a squish pattern as a type of design rule to capture certain DRC (design rule checking) in a pattern-based manner. The term "tag" in FIG. 7F is used to represent the identifier or index; the "count" (938 in this example illustrated in FIG. 7F) represents the total number of contexts or situations that exhibit the specific pattern of interest. In some embodiments, a situation comprises a unique context at a specific scale. In these embodiments, a situation may assume the simplest form—an exact context—having a larger size.

In addition, the term "src_ix" in FIG. 7F represents the source index where a source constitutes an input context. In this example, the "src_ix: 1" identifies which input context this specific pattern of interest is associated with. The numbers in, for example, "loc: [4291 4995 4641 5145] represent the location and coordinates at which the pattern of interest may be found in the layout. The term "symmetry: 32" in this example is used to keep track of pattern symmetries in some embodiments. In some other embodiments, different types of representations may be used for the same purpose. For example, some embodiments may use "R90 R180 MYRO" to keep track of pattern symmetries to indicate a pattern is the same as the pattern of interest if rotated by 90 degrees or 180 degrees or mirrored across the Y-axis without rotation.

Furthermore, the term "rep" in "rep_bits_orient: 2" constitutes the representative situation or context, and "rep_bits_orient: 2" conveys the information of the orientation of the representative context. On the other hand, "rep_delta_orient: 5" indicates the orientation of the deltas on the representative context in some embodiments. In these exemplary embodiments, the pattern of interest may be a symmetric squish pattern but may also have asymmetric delta values such that a different delta value on the left side versus the right side, for example, even though the pattern of interest itself is symmetric if one only looks at the pattern of interest itself. The arguments "0" and "1" in "deltas[0]" and "deltas[1]" represent the X-deltas and Y-deltas, respectively.

Additionally, the example illustrated in FIG. 7 shows that the range "50-150" or "50-198" is surrounded by the value of "1" in "delta range: x_deltas="1 50-150 1" y_deltas="1 50-198 1"". These values of "1" represent the values assigned to the edge scanlines. It shall be noted that these values assigned to the edge scanlines may be large in some cases and may also be the minimum in some other cases. In this example illustrated in FIG. 7, the values of "1" are assigned to the edge scanlines. Nonetheless, other values may also be assigned to the edge scanlines in some other embodiments. Finally, the numbers in "all_deltas" represent the edge deltas or edge spacing in this example, For example, the representation "50:924" indicates that there are 924 instances of 50-nm edge delta or edge spacing, and the representation "1:938" indicates that there are 938 instances at 1-nm edge delta or edge spacing.

Figure 7G:
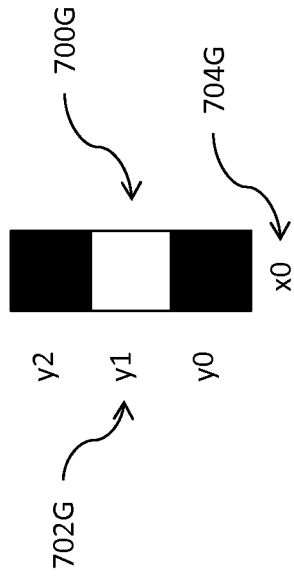
FIG. 7G illustrates an exemplary output for an exemplary analysis of a portion of an electronic circuit design in some embodiments.

FIG. 7G illustrates an exemplary output for an exemplary analysis of a portion of an electronic circuit design in some embodiments. More specifically, FIG. 7G illustrates a squish pattern 700G that may be used as a spacing check rule. Similar to the exemplary output in FIG. 7F, FIG. 7G also shows an exemplary output indicating "y_deltas=1 150-395 1", which indicates that, for example, the values for y1 in an electronic design ranges between 150-nm and 395-nm. In other words, various patterns in an electronic design may be compared against the squish pattern 700G to determine whether there exist any patterns in an electronic design that violate the spacing requirement. For example, FIG. 7G shows the histogram data "y1: 150:33823 155:746 160:621 165:199 170:1786 . . . " that indicates that out of the total 72356 instances of the squish pattern 700G in an electronic design, there are 33823 instances of the squish pattern with 150-nm spacing, 746 instances with 155-nm spacing, 621 instances with 160-nm spacing, 199 instances with 165-nm spacing, and 1786 instances with 170-nm spacing in an electronic design. Therefore, these "matching patterns" as listed under "y1" represent the patterns that meet the spacing requirement. The squish patterns that are not listed in FIG. 7G thus represent the patterns that do not meet the spacing requirement. Therefore, the method described herein can be used to report exact spacing values and how many of such instances are in an electronic design. The method may also leverage the design topologies to provide visual cues to a designer to show where the instances of a squish pattern with a specific spacing are located in the electronic design. For example, if the minimum spacing requirement is changed to 160-nm, the method may thus identify the instances with spacing values smaller than the required 160-nm and present information or data about these violating instances.

Figure 8:
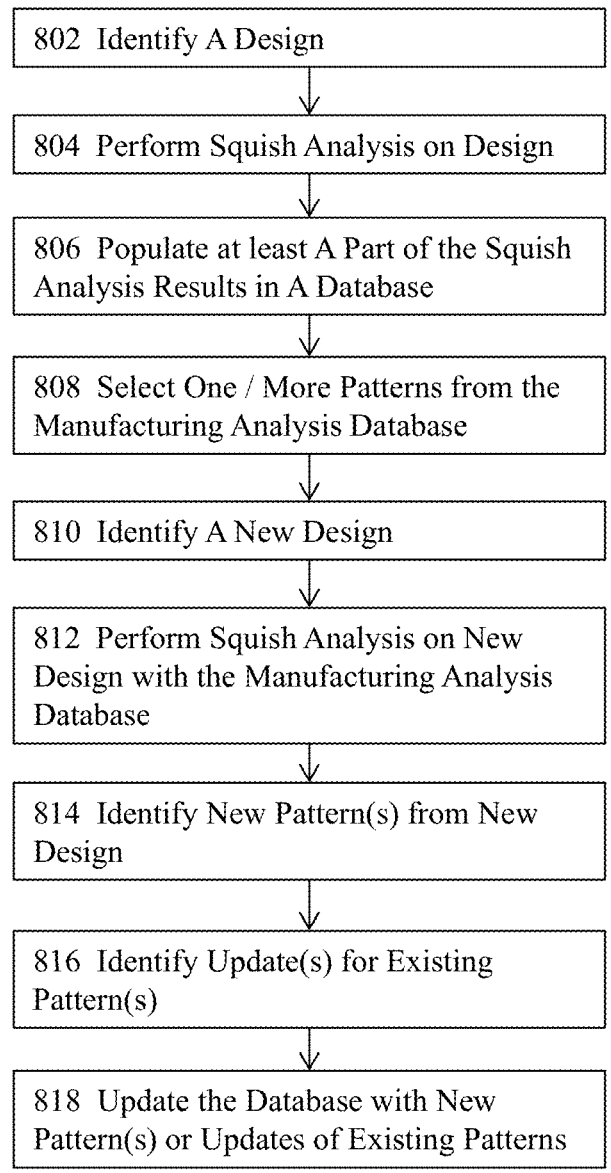
FIG. 8 illustrates a more detailed flow diagram for implementing design analysis in some embodiments.

FIG. 8 illustrates a more detailed flow diagram for implementing design analysis in some embodiments. In one or more embodiments, the method for implementing design analysis may comprise the process 802 of identifying an electronic design. In some embodiments, the method for implementing design analysis may comprise the process 804 of performing squish analysis on the electronic design and the process 806 of populating at least a part of the squish analysis results in a database (e.g., the manufacturing analysis database or a temporary database). A squish analysis comprises sampling and profiling the electronic design against a pattern library (e.g., existing squish patterns in the manufacturing analysis database) to identify matching patterns and also to create one or more new patterns in some embodiments. In some embodiments where the database has already included some data from prior runs, the method may update the database with new or modified data from the current run of the squish analysis. In some embodiments, the method for implementing design analysis may comprise the process 808 of selecting one or more patterns from the manufacturing analysis database. In these embodiments, the method illustrated in FIG. 8 performs the squish analysis to characterize or analyze an electronic design and then populates at least a part of the squish analysis results in a database that may be further used to characterize other electronic designs.

In some embodiments, the method for implementing design analysis may comprise the process 810 of identifying a new electronic design and the process 812 of performing the squish analysis on the new electronic design. In some embodiments, the method for implementing design analysis may comprise the process 814 of identifying one or more new squish patterns from the new electronic design that do not exist in, for example, the pattern library in the manufacturing analysis database. In some embodiments, the method for implementing design analysis may comprise the process 816 of identifying updated information to one or more existing patterns in the pattern library. In some embodiments, the method for implementing design analysis may comprise the process 818 of updating the database to accommodate the updated information. For example, the method may determine at 816 that the range or the discrete set of acceptable values for a specific squish pattern may be augmented to accommodate a new range or additional discrete values determined from the new electronic design. In this example, the method may then update, at 818, one or more squish patterns or the data or information associated with the one or more squish patterns in the manufacturing analysis database.

Figure 9:
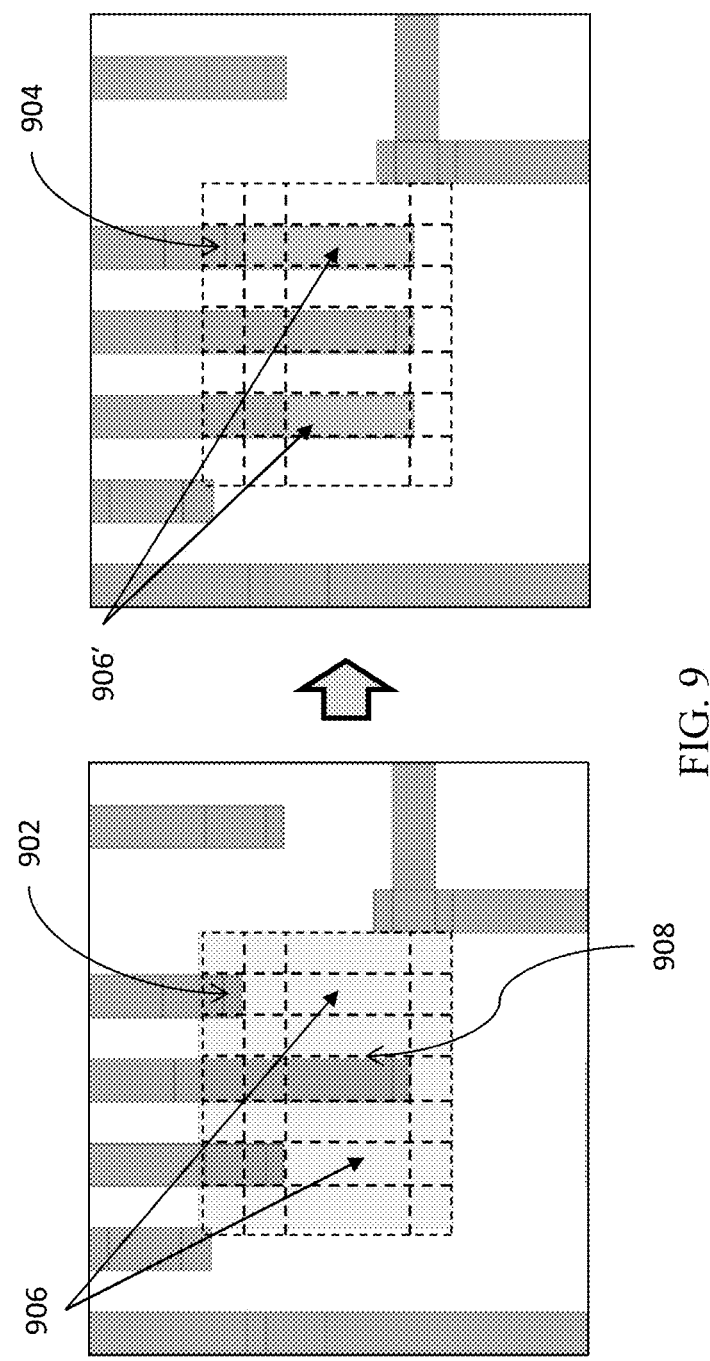
FIG. 9 illustrates an exemplary result of a search and replace process for some geometric shapes using some embodiments of the application in a portion of an electronic design in some embodiments.

FIG. 9 illustrates an exemplary result of a search and replace process for some geometric shapes using some embodiments of the application in a portion of an electronic design in some embodiments. More specifically, FIG. 9 illustrates a matching pattern 902 has been identified to match an existing squish pattern illustrated in dashed lines for clarity purposes. In this example, if the pattern 902 is determined to cause a violation of design rules or a failure, the method described herein may perform a search and replace process to replace the pattern 902 with a compliant pattern 904. By following the processes described herein, the method may identify the matching pattern 902 from an electronic design, identify the replacement pattern 904 from the manufacturing analytics in or associated with the manufacturing analysis database, and toggle certain bits on or off in the matching squish pattern 902 based on the replacement pattern 904. For example, the fields indicated by 906' originally have the value "0" in the matching pattern 902 but the replacement pattern 904 are showing values of "1" in these fields. As a result, the method may simply toggle the values in the pertinent fields of the matching 902 to become the replacement pattern 904. In this example, the replacement pattern 904 comprises an "additive" pattern. In other examples, "subtractive" patterns may also be used where certain fields having the value "1" will be toggled off to have the value "0" based on the "subtractive" replacement pattern. Further the replacement pattern does not need to align exactly to the squish pattern. In some implementations the "additive" or "subtractive" patterns can include an offset value to indicate a placement relative to the squish pattern.

System Architecture Overview

Figure 10:
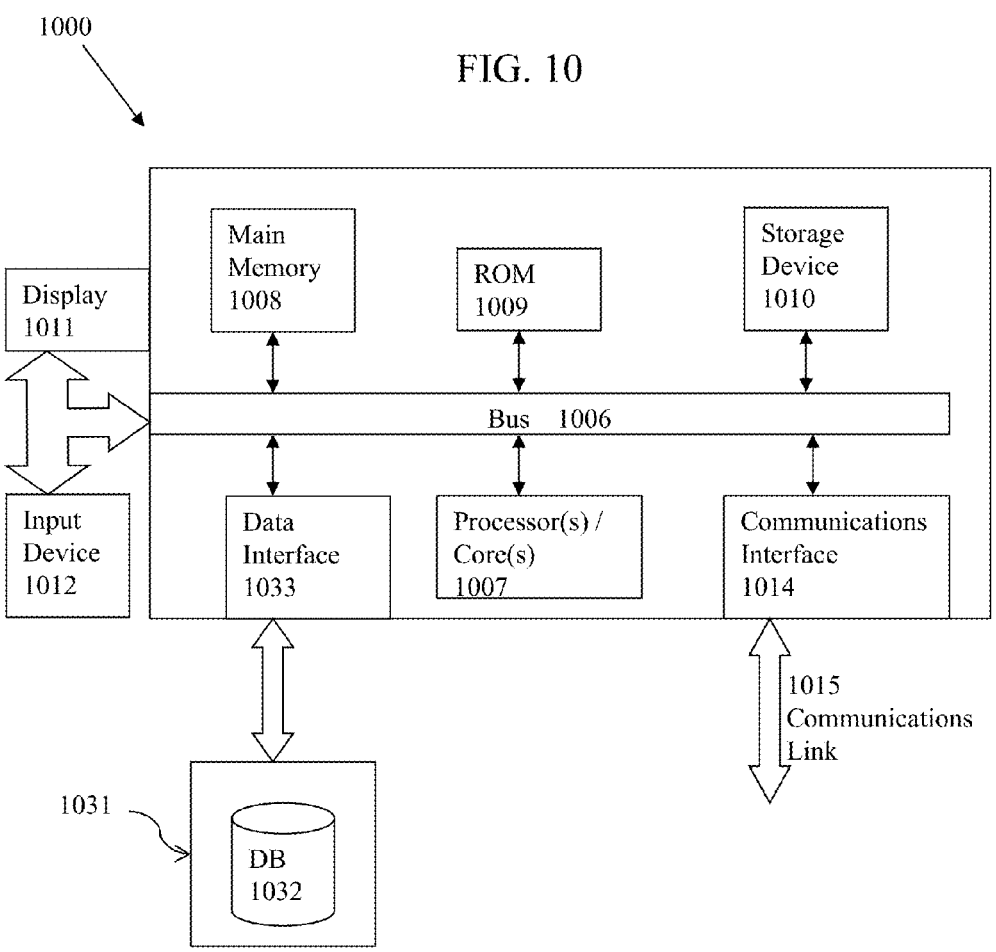
FIG. 10 illustrates a computerized system on which a method for implementing multi-layer local maximal spanning routing paths may be implemented.

FIG. 10 illustrates a block diagram of an illustrative computing system 1000 suitable for implementing a physical electronic circuit design with multiple-patterning techniques as described in the preceding paragraphs with reference to various figures. Computer system 1000 includes a bus 1006 or other communication mechanism for communicating information, which interconnects subsystems and devices, such as processor 1007, system memory 1008 (e.g., RAM), static storage device 1009 (e.g., ROM), disk drive 1010 (e.g., magnetic or optical), communication interface 1014 (e.g., modem or Ethernet card), display 1011 (e.g., CRT or LCD), input device 1012 (e.g., keyboard), and cursor control (not shown).

According to one embodiment, computer system 1000 performs specific operations by one or more processor or processor cores 1007 executing one or more sequences of one or more instructions contained in system memory 1008. Such instructions may be read into system memory 1008 from another computer readable/usable storage medium, such as static storage device 1009 or disk drive 1010. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1007, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1007 for execution. Such a medium may take many forms, including but not limited to, non-volatile media and volatile media. Non-volatile media includes, for example, optical or magnetic disks, such as disk drive 1010. Volatile media includes dynamic memory, such as system memory 1008.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1000. According to other embodiments of the invention, two or more computer systems 1000 coupled by communication link 1015 (e.g., LAN, PTSN, or wireless network) may perform the sequence of instructions required to practice the invention in coordination with one another.

Computer system 1000 may transmit and receive messages, data, and instructions, including program, i.e., application code, through communication link 1015 and communication interface 1014. Received program code may be executed by processor 1007 as it is received, and/or stored in disk drive 1010, or other non-volatile storage for later execution. In an embodiment, the computer system 1000 operates in conjunction with a data storage system 1031, e.g., a data storage system 1031 that contains a database 1032 that is readily accessible by the computer system 1000. The computer system 1000 communicates with the data storage system 1031 through a data interface 1033. A data interface 1033, which is coupled to the bus 1006, transmits and receives electrical, electromagnetic or optical signals that include data streams representing various types of signal information, e.g., instructions, messages and data. In embodiments of the invention, the functions of the data interface 1033 may be performed by the communication interface 1014.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing pattern-based design enabled manufacturing of electronic circuit designs, comprising:
at least one processor or at least one processor core executing a process, the process comprising:
indexing a database using multiple patterns that represent data across one or more wafers, designs, processes, or foundries as database indices;
generating results that include a pattern identified from the electronic design of a pattern analysis at least by performing the pattern analysis on at least a portion of an electronic circuit design by using at least the database to identify the pattern from the electronic circuit design;
identifying a new pattern from at least the portion of the electronic circuit design, wherein the new pattern does not exist in the database;
tracking at least one pattern or the new pattern in the database to develop historical data for the at least one pattern; and
providing results of the pattern analysis to a manufacturing tool.

2. The computer implemented method of claim 1, wherein the manufacturing tool is to perform at least one of a metrology function, an inspection function, a fabrication process, and a testing on an electronic circuit that is fabricated according to the electronic circuit design.

3. The computer implemented method of claim 2, the process further comprising:
overlaying a form of the results at a correct location relative to the electronic circuit in a display apparatus of the manufacturing tool that operates on the electronic circuit that is fabricated according to the electronic circuit design.

4. The computer implemented method of claim 1, wherein performing pattern analysis comprises:
identifying an existing pattern from the database; and
profiling the at least a portion of the electronic circuit design based at least in part upon the existing pattern.

5. The computer implemented method of claim 1, the process further comprising:
performing one or more statistical analyses on the historical data;
training the process by using at least results of the one or more statistical analyses; and
updating the database with at least some of the results of the one or more statistical analyses.

6. The computer implemented method of claim 1, in which the multiple patterns comprises a topological pattern or a squish pattern.

7. The computer implemented method of claim 1, in which the pattern analysis results comprise failure or violation information that has accuracy beyond accuracy limits of the manufacturing tool.

8. The computer implemented method of claim 1, the process further comprising:
performing a search and replace process to replace a pattern in the at least a portion of the electronic circuit design by toggling one or more values stored in a data structure of the pattern based at least in part upon a replacement pattern.

9. The computer implemented method of claim 1, further comprising forwarding a compatible form of at least some of the pattern analysis results to one or more additional analyses that comprise at least one of a yield analysis, a defect or failure analysis, and a tape-out analysis.

10. A system for implementing pattern-based design enabled manufacturing of electronic circuit designs, comprising:
at least one processor or at least one processor core that is at least to:
index a database using multiple patterns that represent data across one or more wafers, designs, processes, or foundries as database indices;
generate results that include a pattern identified from the electronic design of a pattern analysis at least by performing the pattern analysis on at least a portion of an electronic circuit design by using at least the database to identify the pattern from the electronic circuit design;

identify a new pattern from at least the portion of the electronic circuit design, wherein the new pattern does not exist in the database;

track at least one pattern or the new pattern in the database to develop historical data for the at least one pattern; and provide results of the pattern analysis to a manufacturing tool.

11. The system of claim 10, wherein the manufacturing tool is to perform at least one of a metrology function, an inspection function, a fabrication process, and a testing on an electronic circuit that is fabricated according to the electronic circuit design.

12. The system of claim 11, in which the at least one processor or at least one processor core is further to:

overlay a form of the results at a correct location relative to the electronic circuit in a display apparatus of the manufacturing tool that operates on the electronic circuit that is fabricated according to the electronic circuit design.

13. The system of claim 10, in which the at least one processor or at least one processor core that is to perform pattern analysis is further to:

identify an existing pattern from the database; and profile the at least a portion of the electronic circuit design based at least in part upon the existing pattern.

14. The system of claim 10, in which the at least one processor or at least one processor core is further to:

perform one or more statistical analyses on the historical data;

train the process by using at least results of the one or more statistical analyses; and update the database with at least some of the results of the one or more statistical analyses.

15. The system of claim 10, in which the at least one processor or at least one processor core is further to:

perform a search and replace process to replace a pattern in the at least a portion of the electronic circuit design by toggling one or more values stored in a data structure of the pattern based at least in part upon a replacement pattern.

16. The system of claim 10, in which the at least one processor or at least one processor core is further to forward a compatible form of at least some of the results of analyzing the at least a portion of the electronic circuit design to one or more additional analyses that comprise at least one of a yield analysis, a defect or failure analysis, and a tape-out analysis.

17. An article of manufacture comprising a non-transitory computer accessible storage medium having stored thereupon a sequence of instructions which, when executed by at least one processor or at least one processor core executing one or more threads, causes the at least one processor or the at least one processor core to perform a method for implementing pattern-based design enabled manufacturing of electronic circuit designs, the method comprising:

at least one processor or at least one processor core executing a process, the process comprising:

indexing a database using multiple patterns that represent data across one or more wafers, designs, processes, or foundries as database indices;

generating results that include a pattern identified from the electronic design of a pattern analysis at least by performing the pattern analysis on at least a portion of an electronic circuit design by using at least the database to identify the pattern from the electronic circuit design;

identifying a new pattern from at least the portion of the electronic circuit design, wherein the new pattern does not exist in the database;

tracking at least one pattern or the new pattern in the database to develop historical data for the at least one pattern; and providing results of the pattern analysis to a manufacturing tool.

18. The article of manufacture of claim 17, wherein the manufacturing tool is to perform at least one of a metrology function, an inspection function, a fabrication process, and a testing on an electronic circuit that is fabricated according to the electronic circuit design.

19. The article of manufacture of claim 18, the process further comprising:

overlaying a form of the results at a correct location relative to the electronic circuit in a display apparatus of the manufacturing tool that operates on the electronic circuit that is fabricated according to the electronic circuit design.

20. The article of manufacture of claim 17, the act of analyzing at least a portion of an electronic circuit design comprising:

identifying an existing pattern from the database; and profiling the at least a portion of the electronic circuit design based at least in part upon the existing pattern.

21. The article of manufacture of claim 17, the process further comprising:

performing one or more statistical analyses on the historical data;

training the process by using at least results of the one or more statistical analyses; and updating the database with at least some of the results of the one or more statistical analyses.

22. The article of manufacture of claim 17, the process further comprising:

performing a search and replace process to replace a pattern in the at least a portion of the electronic circuit design by toggling one or more values stored in a data structure of the pattern based at least in part upon a replacement pattern.

23. The article of manufacture of claim 17, further comprising forwarding a compatible form of at least some of the pattern analysis results to one or more additional analyses that comprise at least one of a yield analysis, a defect or failure analysis, and a tape-out analysis.

* * * * *